United States Patent
Radu et al.

(10) Patent No.: US 9,972,783 B2
(45) Date of Patent: May 15, 2018

(54) HIGH ENERGY TRIARYLAMINE COMPOUNDS FOR HOLE TRANSPORT MATERIALS

(71) Applicant: E I DU PONT DE NEMOURS AND COMPANY, Wilmington, DE (US)

(72) Inventors: Nora Sabina Radu, Landenberg, PA (US); Jerald Feldman, Wilmington, DE (US); Daniel David Lecloux, Midland, MI (US); Ying Wang, Wilmington, DE (US); Adam Fennimore, Wilmington, DE (US); Kerwin D Dobbs, Wilmington, DE (US); Gene M Rossi, Wilmington, DE (US); Charles D McLaren, Landenberg, PA (US); Frederick P Gentry, Bear, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 119 days.

(21) Appl. No.: 15/074,728

(22) Filed: Mar. 18, 2016

(65) Prior Publication Data
US 2016/0285000 A1 Sep. 29, 2016

Related U.S. Application Data

(60) Provisional application No. 62/138,010, filed on Mar. 25, 2015.

(51) Int. Cl.
*B32B 9/00* (2006.01)
*B32B 19/00* (2006.01)
(Continued)

(52) U.S. Cl.
CPC .......... *H01L 51/0035* (2013.01); *C08G 61/12* (2013.01); *C09K 11/06* (2013.01);
(Continued)

(58) Field of Classification Search
None
See application file for complete search history.

(56) References Cited

U.S. PATENT DOCUMENTS 6,670,645 B2  12/2003  Grushin et al.
6,875,524 B2  4/2005   Hatwar et al.
(Continued)

FOREIGN PATENT DOCUMENTS

JP  10265773 A  * 10/1998
WO  03040257 A1  5/2003
(Continued)

OTHER PUBLICATIONS

Markus, John; Photoconductive Cell; Electronics and Nucleonics Dictionary; 1966; pp. 470-471 and 476.
(Continued)

*Primary Examiner* — Eli Mekhlin

(57) ABSTRACT

This invention relates to triarylamine compounds and compositions including such compounds, that are useful in electronic applications. It also relates to electronic devices in which the active layer includes such a compound or composition. The triarylamine compound can be present as a hole transport material in a hole transport layer. The triarylamine compound can also be present in a photoactive layer in combination with an organometallic compound capable of electroluminescence having an emission maximum between 380 and 750 nm.

14 Claims, 1 Drawing Sheet

(51) Int. Cl.
*H01L 51/00* (2006.01)
*C09K 11/06* (2006.01)
*C08G 61/12* (2006.01)
*H01L 51/50* (2006.01)

(52) U.S. Cl.
CPC ...... *H01L 51/0043* (2013.01); *H01L 51/0059* (2013.01); *H01L 51/0094* (2013.01); *C08G 2261/1434* (2013.01); *C08G 2261/312* (2013.01); *C08G 2261/3162* (2013.01); *C08G 2261/3323* (2013.01); *C08G 2261/344* (2013.01); *C08G 2261/3424* (2013.01); *C08G 2261/512* (2013.01); *C08G 2261/95* (2013.01); *C09K 2211/1007* (2013.01); *C09K 2211/1014* (2013.01); *C09K 2211/1029* (2013.01); *C09K 2211/1044* (2013.01); *C09K 2211/1059* (2013.01); *C09K 2211/185* (2013.01); *H01L 51/0085* (2013.01); *H01L 51/5016* (2013.01); *H01L 51/5056* (2013.01)

(56) References Cited

U.S. PATENT DOCUMENTS

| | | | |
|---|---|---|---|
| 7,365,230 B2 | 4/2008 | Herron et al. | |
| 7,838,627 B2 | 11/2010 | Radu et al. | |
| 7,960,587 B2 | 6/2011 | Herron et al. | |
| 2004/0102577 A1 | 5/2004 | Hsu et al. | |
| 2004/0127637 A1 | 7/2004 | Hsu et al. | |
| 2005/0158577 A1 | 7/2005 | Ishibashi et al. | |
| 2005/0205860 A1 | 9/2005 | Hsu et al. | |
| 2007/0063638 A1 | 3/2007 | Tokairin et al. | |
| 2007/0292713 A9 | 12/2007 | Dobbs et al. | |
| 2011/0253986 A1* | 10/2011 | Wang ............... | C07C 211/54 257/40 |

FOREIGN PATENT DOCUMENTS

| | | |
|---|---|---|
| WO | 03063555 A1 | 7/2003 |
| WO | 2004016710 A1 | 2/2004 |
| WO | 2005052027 A1 | 6/2005 |
| WO | 2007021117 A1 | 2/2007 |
| WO | 2009018009 A1 | 2/2009 |

OTHER PUBLICATIONS

Wang, Ying; Dramatic effects fo hole transport layer on the efficiency of iridium-based organic light-emitting diodes; Applied Physics Letters; 2004; pp. 4848-4850.

Wang, Ying; Photoconductive Polymers; ECT; vol. 18; pp. 837-860.

Gustafsson, G; Flexible light-emitting diodes made from soluble conducting polymers; Nature; vol. 357; pp. 477-479.

* cited by examiner

HIGH ENERGY TRIARYLAMINE COMPOUNDS FOR HOLE TRANSPORT MATERIALS

BACKGROUND

Field of the Disclosure

The present disclosure relates to novel hole transport compounds and compositions having such compounds. The disclosure further relates to electronic devices having at least one layer comprising such a hole transport compound composition having such compound.

Description of the Related Art

In organic electronic devices, such as organic light emitting diodes ("OLED"), that make up OLED displays, one or more organic electroactive layers are sandwiched between two electrical contact layers. In an OLED at least one organic electroactive layer emits light through the light-transmitting electrical contact layer upon application of a voltage across the electrical contact layers.

It is well known to use organic electroluminescent compounds as the light-emitting component in light-emitting diodes. Simple organic molecules, conjugated polymers, and organometallic complexes have been used. Devices that use electroluminescent materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for new materials for electronic devices.

SUMMARY

The present invention is directed to compounds, compositions, methods and devices having triarylamine compounds separated by conjugation breaking groups to increase triplet energy. An aryl-N group of the triarylamine compound structure is positioned outside the planar surface of the aryl groups attached to the conjugation breaking groups.

There is provided a triarylamine compound having Formula I

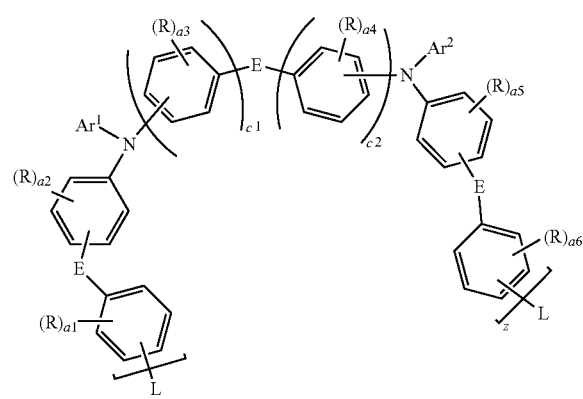

(I)

where:
E is the same or different at each occurrence and is selected from the group consisting of $(CR'_2)_x$, O, $(SiR'_2)_x$, $(GeR'_2)_x$, S, and Se;

R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;

R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;

L is the same or different at each occurrence and is selected from the group consisting of H, D, halogen, alkyl, aryl, crosslinkable groups, deuterated alkyl, deuterated aryl, and deuterated crosslinkable groups;

$Ar^1$ and $Ar^2$ are the same or different and are selected from the group consisting of aryl groups and deuterated analogs thereof;

a1-a6 are the same or different at each occurrence and are an integer of 0-4;

c1 and c2 are the same or different and are an integer of 1-4;

x is an integer of 1-6; and z is an integer greater than 0.

There is also provided a triarylamine compound having Formula IA,

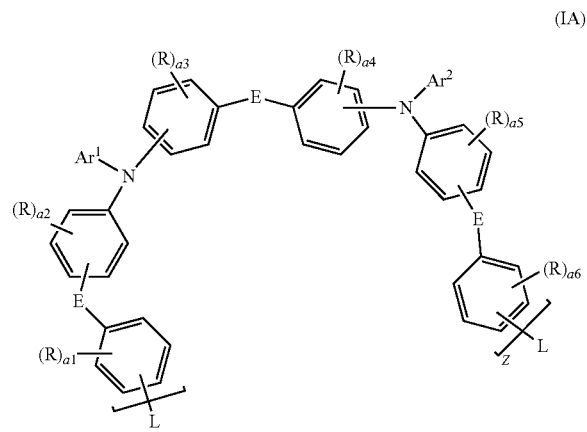

(IA)

where:
E is the same or different at each occurrence and is selected from the group consisting of $(CR'_2)_x$, O, $(SiR'_2)_x$, $(GeR'_2)_x$, S, and Se;

R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;

R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;

L is the same or different at each occurrence and is selected from the group consisting of H, D, halogen, alkyl, aryl, crosslinkable groups, deuterated alkyl, deuterated aryl, and deuterated crosslinkable groups;

Ar$^1$ and Ar$^2$ are the same or different and are selected from the group consisting of aryl groups and deuterated analogs thereof;

a1-a6 are the same or different and are an integer of 0-4;

x is an integer of 1-6; and z is an integer greater than 0.

There is also provided a triarylamine compound having Formula IIA or Formula IIB

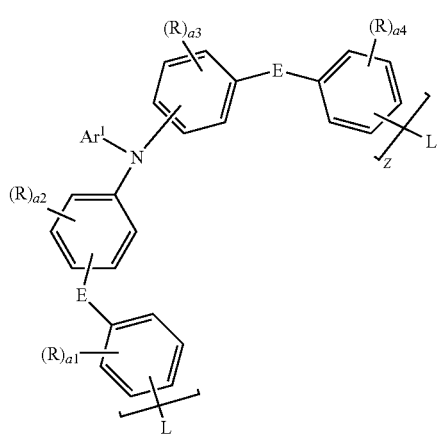

(IIA)

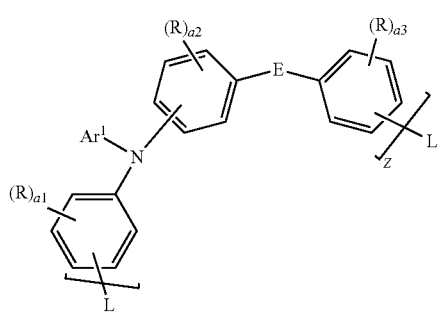

(IIB)

where:
- E is the same or different at each occurrence and is selected from the group consisting of $(CR'_2)_x$, O, $(SiR'_2)_x$, $(GeR'_2)_x$, S, and Se;
- R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;
- R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;
- L is the same or different at each occurrence and is selected from the group consisting of H, D, halogen, alkyl, aryl, crosslinkable groups, deuterated alkyl, deuterated aryl, and deuterated crosslinkable groups;
- Ar$^1$ is selected from the group consisting of aryl groups and deuterated analogs thereof;
- a1-a4 are the same or different and are an integer of 0-4;
- x is an integer of 1-6; and
- z is an integer greater than 0.

There is also provided a triarylamine compound having Formula III

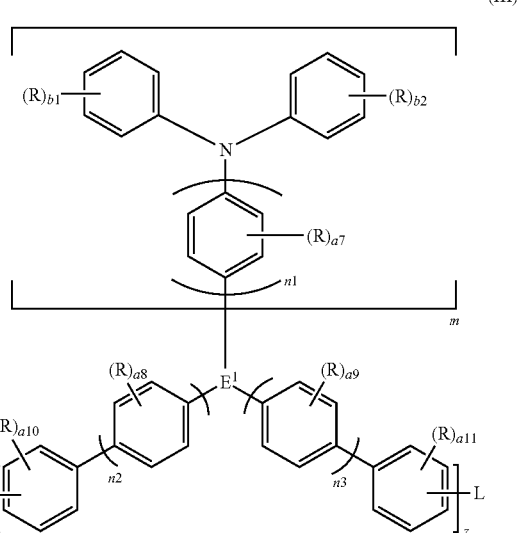

(III)

where:
- E$^1$ is selected from the group consisting of Si, Ge, PO, SiR', and GeR';
- R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;
- R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;
- L is the same or different at each occurrence and is selected from the group consisting of H, D, halogen, alkyl, aryl, crosslinkable groups, deuterated alkyl, deuterated aryl, and deuterated crosslinkable groups;
- a7-a11 are the same or different at each occurrence and are an integer of 0-4;
- b1 and b2 are the same or different and are an integer of 0-5;
- m=2 when E$^1$=Si, Ge;
- m=1 when E$^1$=PO, SiR', or GeR';
- n1, n2, and n3 are the same or different and are an integer of 0-3; and
- z is an integer greater than 0.

There is further provided a copolymer having at least one monomeric unit of Formula I-m, Formula IA-m, Formula IIA-m, Formula IIB-m, or Formula III-m (I-m)

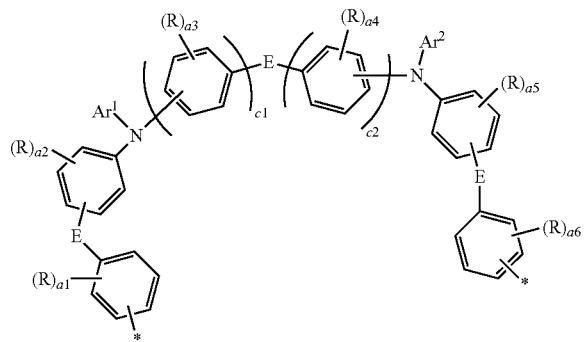

(IA-m)

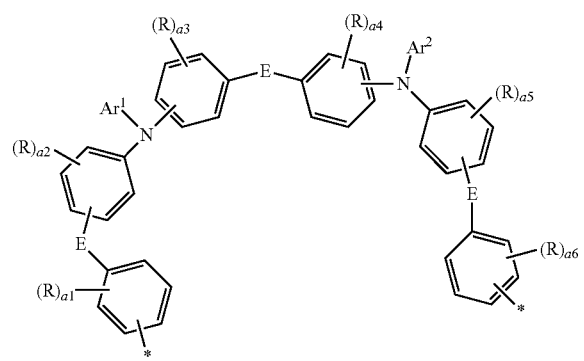

(IIA-m)

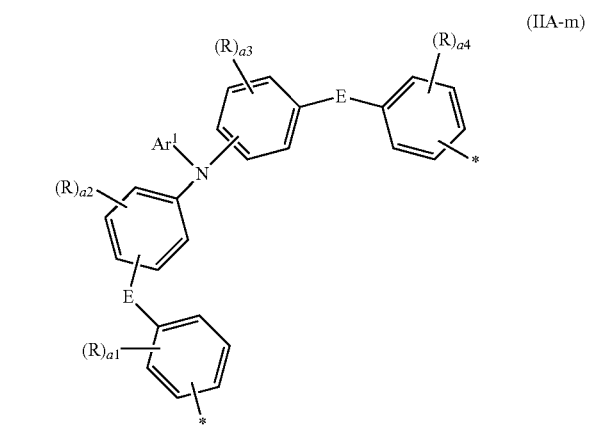

(IIB-m)

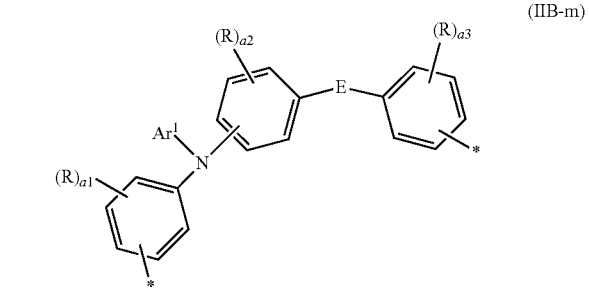

(III-m)

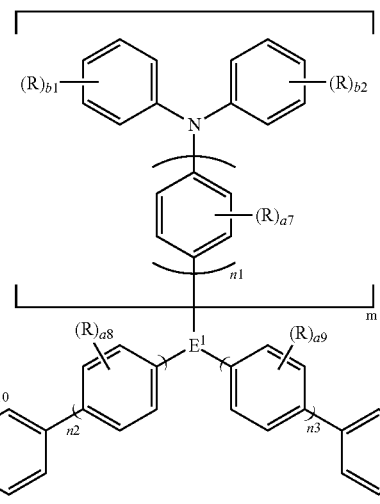

where * represents a point of attachment in the copolymer, and $Ar^1$, $Ar^2$, E, $E^1$, R, R', a1-a11, b1, b2, c1, c2, m, n1-n3, and x are as defined above.

There is further provided an electroactive composition comprising (a) a triarylamine compound having Formula I, Formula IA, Formula IIA, Formula IIB, or Formula III, or a copolymer having at least one monomeric unit having Formula I-m, IIA-m, IIB-m, or III-m, and (b) an organometallic dopant capable of electroluminescence having an emission maximum between 380 and 750 nm.

There is further provided an organic electronic device comprising a first electrical contact layer, a second electrical contact layer, and at least one active layer there between, wherein the active layer comprises a triarylamine compound having Formula I, Formula IA, Formula IIA, Formula IIB, or Formula III.

There is further provided an organic electronic device comprising a first electrical contact layer, a second electrical contact layer, and at least one active layer there between, wherein the active layer comprises a triarylamine copolymer having at least one monomeric unit of Formula I-m, Formula IA-m, Formula IIA-m, Formula IIB-m, or Formula III-m.

BRIEF DESCRIPTION OF THE DRAWINGS

Embodiments are illustrated in the accompanying figures to improve understanding of concepts as presented herein.

Figure 1:
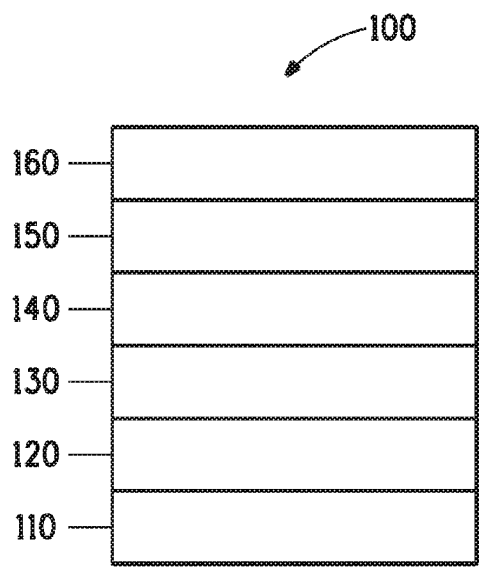
FIG. 1 includes an illustration of one example of an organic electronic device including a compound of the invention.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are disclosed herein and are exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Triarylamine Compound, the Electronic Device, and finally Examples.

1. Definitions and Clarification of Terms

Before addressing details of embodiments described below, some terms are defined or clarified.

As used in the "Definitions and Clarification of Terms", R, R' and R" and any other variables are generic designations and may be the same as or different from those defined in the formulas.

As used herein, the term "alkyl" includes branched and straight-chain saturated aliphatic hydrocarbon groups. Unless otherwise indicated, the term is also intended to include cyclic groups. Examples of alkyl groups include methyl, ethyl, propyl, isopropyl, isobutyl, secbutyl, tertbutyl, pentyl, isopentyl, neopentyl, cyclopentyl, hexyl, cyclohexyl, isohexyl and the like. The term "alkyl" further includes both substituted and unsubstituted hydrocarbon groups. In some embodiments, the alkyl group may be mono-, di- and tri-substituted. One example of a substituted alkyl group is trifluoromethyl. Other substituted alkyl groups are formed from one or more of the substituents described herein. In certain embodiments alkyl groups have 1 to 20 carbon atoms. In other embodiments, the group has 1 to 6 carbon atoms. The term is intended to include heteroalkyl groups. Heteroalkyl groups may have from 1-20 carbon atoms.

The term "aromatic compound" is intended to mean an organic compound comprising at least one unsaturated cyclic group having 2n+2 delocalized pi electrons. The term is intended to encompass both aromatic compounds having only carbon and hydrogen atoms, and heteroaromatic compounds wherein one or more of the carbon atoms within the cyclic group have been replaced by another atom, such as nitrogen, oxygen, sulfur, or the like.

The term "aryl" or "aryl group" means a moiety derived from an aromatic compound. A group "derived from" a compound, indicates the radical formed by removal of one or more H or D. The aryl group may be a single ring (monocyclic) or multiple rings (bicyclic, or more) fused together or linked covalently. Examples of aryl moieties include, but are not limited to, phenyl, 1-naphthyl, 2-naphthyl, dihydronaphthyl, tetrahydronaphthyl, biphenyl, anthryl, phenanthryl, fluorenyl, indanyl, biphenylenyl, acenaphthenyl, acenaphthylenyl, and the like. In some embodiments, aryl groups have 6 to 60 ring carbon atoms; in some embodiments, 6 to 30 ring carbon atoms. The term is intended to include heteroaryl groups. Heteroaryl groups may have from 4-50 ring carbon atoms; in some embodiments, 4-30 ring carbon atoms.

The term "alkoxy" is intended to mean the group —OR, where R is alkyl.

The term "aryloxy" is intended to mean the group —OR, where R is aryl.

Unless otherwise indicated, all groups can be substituted or unsubstituted. An optionally substituted group, such as, but not limited to, alkyl or aryl, may be substituted with one or more substituents which may be the same or different. Suitable substituents include D, alkyl, aryl, nitro, cyano, —N(R)(R"), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, silyl, siloxane, thioalkoxy, —S(O)$_2$—N(R')(R"), —C(=O)—N(R')(R"), (R')(R")N-alkyl, (R')(R")N-alkoxyalkyl, (R')(R")N-alkylaryloxyalkyl, —S(O)$_s$-aryl (where s=0-2) or —S(O)$_s$-heteroaryl (where s=0-2). Each R' and R" is independently an optionally substituted alkyl, cycloalkyl, or aryl group. R' and R", together with the nitrogen atom to which they are bound, can form a ring system in certain embodiments. Substituents may also be crosslinking groups.

In a structure where a substituent bond passes through one or more rings as shown below,

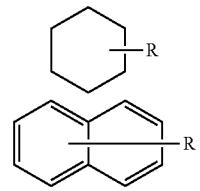

it is meant that the substituent R may be bonded at any available position on the one or more rings.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport materials facilitate negative charge. Although light-emitting materials may also have some charge transport properties, the term "charge transport layer, material, member, or structure" is not intended to include a layer, material, member, or structure whose primary function is light emission.

The term "compound" is intended to mean an electrically uncharged substance made up of molecules that further include atoms, wherein the atoms cannot be separated from their corresponding molecules by physical means without breaking chemical bonds. The term is intended to include oligomers and polymers.

The term "crosslinkable group" or "crosslinking group" is intended to mean a group on a compound or polymer chain than can link to another compound or polymer chain via thermal treatment, use of an initiator, or exposure to radiation, where the link is a covalent bond. In some embodiments, the radiation is UV or visible. Examples of crosslinkable groups include, but are not limited to vinyl, acrylate, perfluorovinylether, 1-benzo-3,4-cyclobutane, o-quinodimethane groups, siloxane, cyanate groups, cyclic ethers (epoxides), cycloalkenes, and acetylenic groups.

The term "deuterated" is intended to mean that at least one hydrogen ("H") has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level.

The term "electroactive" as it refers to a layer or a material, is intended to indicate a layer or material which electronically facilitates the operation of the device. Examples of electroactive materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The prefix "fluoro" is intended to indicate that one or more hydrogens in a group has been replaced with fluorine.

The term "germyl" refers to the group $R_3Ge$—, where R is H, D, C1-20 alkyl, fluoroalkyl, aryl, C1-20 deuterated alkyl, deuterated partially fluorinated alkyl, or deuterated aryl. A deuterated germyl group is one in which one or more R groups are deuterated.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "photoactive" refers to a material or layer that emits light when activated by an applied voltage (such as in a light emitting diode or chemical cell), that emits light after the absorption of photons (such as in down-converting phosphor devices), or that responds to radiant energy and generates a signal with or without an applied bias voltage (such as in a photodetector or a photovoltaic cell).

The term "silyl" refers to the group $R_3Si$—, where R is H, D, C1-20 alkyl, fluoroalkyl, aryl, C1-20 deuterated alkyl, deuterated partially fluorinated alkyl, or deuterated aryl. In some embodiments, one or more carbons in an R alkyl group are replaced with Si. In some embodiments, the silyl groups are $(hexyl)_2Si(Me)CH_2CH_2Si(Me)_2$- and $[CF_3(CF_2)_6CH_2CH_2]_2SiMe$-. A deuterated silyl group is one in which one or more R groups are deuterated.

The term "siloxane" refers to the group $(RO)_3Si$—, where R is H, D, C1-20 alkyl, or fluoroalkyl.

The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond). Exemplary adjacent R groups are shown below:

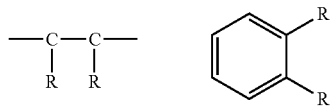

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Triarylamine Compounds

The triarylamine compounds of the present invention have a unique design which provides a high energy hole transport material. The triarylamine compounds are separated by conjugation breaking groups to increase triplet energy. An aryl-N group of the triarylamine compound structures is positioned outside the planar surface of the aryl groups attached to the conjugation breaking groups.

The term "triplet energy" refers to the lowest excited triplet state of a material, in eV. Triplet energies are reported as positive numbers and represent the energy of the triplet state relative to the ground state, usually a singlet state.

Luminescent organometallic materials emit from excited states having mixed singlet and triplet character and are referred to herein as "phosphorescent". When organometallic phosphorescent materials are used in the light-emitting layer, the presence of materials having low triplet energy leads to quenching of phosphorescent emission of >2.0 eV energy. This leads to decreased efficiency. Quenching can occur when the materials are in the electroluminescent layer, such as a host material, or in a layer adjacent to the electroluminescent layer, such as a hole transport layer. In some embodiments, the new triarylamine compound or copolymer described herein has a triplet energy level greater than 2.1 eV; in some embodiments, greater than 2.5 eV; in some embodiments, greater than 2.9 eV; in some embodiments, greater than 3.0 eV. The triplet energy can either be calculated a priori, or be measured using pulse radiolysis or low temperature luminescence spectroscopy.

In some embodiments, a triarylamine compound of the present invention has Formula I,

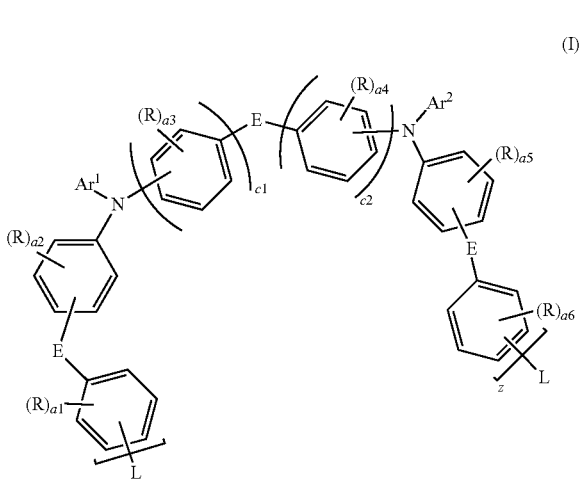

(I)

where:
- E is the same or different at each occurrence and is selected from the group consisting of $(CR'_2)_x$, O, $(SiR'_2)_x$, $(GeR'_2)_x$, S, and Se;
- R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;
- R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;
- L is the same or different at each occurrence and is selected from the group consisting of H, D, halogen, alkyl, aryl, crosslinkable groups, deuterated alkyl, deuterated aryl, and deuterated crosslinkable groups;
- $Ar^1$ and $Ar^2$ are the same or different and are selected from the group consisting of aryl groups and deuterated analogs thereof;
- a1-a6 are the same or different at each occurrence, and are an integer of 0-4;
- c1 and c2 are the same or different and are an integer of 1-4;
- x is an integer of 1-6; and
- z is an integer greater than 0.

In some embodiments of Formula I, no two adjacent R groups are joined to form a ring, and R is the same or different at each occurrence and is selected from the group consisting of D, alkyl, silyl, germyl, aryl, deuterated alkyl, deuterated silyl, deuterated germyl, and deuterated aryl.

In some embodiments, the compound having Formula I is a small molecule with z=1.

In some embodiments, the compound having Formula I is an oligomer, with z=2-5.

In some embodiments, the compound having Formula I is a polymer, with z>5.

Designating polymers with a variable such as "z" (or "n") is standard practice in the chemical arts. One of ordinary skill in the art would know that there is no exact upper limit for z. The number of units in a given polymer is determined by the chemistry of the monomer, polymerization reaction conditions, and other known factors.

One skilled in the art will recognize, as used herein, compounds including an illustrated formula are intended to include small molecules, oligomers and polymers.

In some embodiments of Formula I, z=1 and L is a crosslinkable group.

In some embodiments of Formula I, z=1 and L is a halogen. Such compounds can be useful as monomers for the formation of polymeric compounds. In some embodiments, the halogen is Cl or Br; in some embodiments, Br.

In some embodiments, the triarylamine compound is at least 10% deuterated. By this is meant that at least 10% of the hydrogens in the compound have been replaced by deuterium. In some embodiments, the triarylamine compound is at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

Deuterated materials can be less susceptible to degradation by holes, electrons, excitons, or a combination thereof. Deuteration can potentially inhibit degradation of the compound during device operation, which in turn can lead to improved device lifetime. In general, this improvement is accomplished without sacrificing other device properties. Furthermore, the deuterated compounds frequently have greater air tolerance than the non-deuterated analogs. This can result in greater processing tolerance both for the preparation and purification of the materials and in the formation of electronic devices using the materials.

In some embodiments of Formula I, at least one E is $(CR'_2)_x$ where x=1 or 2.

In some embodiments of Formula I, at least one E is $(CR'_2)_x$ where R' is C1-12 alkyl or deuterated analog thereof.

In some embodiments of Formula I, at least one E is $(CR'_2)_x$ where both R' are joined together to form a cyclohexyl ring or deuterated analog thereof.

In some embodiments of Formula I, at least one E is $(SiR'_2)_x$ where x=1 or 2.

In some embodiments of Formula I, at least one E is $(SiR'_2)_x$ where R' is C1-12 alkyl or deuterated analog thereof.

In some embodiments of Formula I, at least one E is $(SiR'_2)_x$ where both R' are joined together to form a cyclohexyl ring or deuterated analog thereof.

In some embodiments of Formula I, at least one E is $(SiR'_2)_x$ where R' is C6-18 aryl or deuterated analog thereof.

In some embodiments of Formula I, at least one E is O, S, or Se.

In some embodiments of Formula I, at least one E is O.

In some embodiments of Formula I, E is selected from the group consisting of O, $(SiR'_2)_x$, $(GeR'_2)_x$, S, and Se.

In some embodiments of Formula I, E is selected from the group consisting of $(SiR'_2)_x$ and $(GeR'_2)_x$.

In some embodiments of Formula I, at least one a1=0.
In some embodiments of Formula I, at least one a1=1.
In some embodiments of Formula I, at least one a1=2.
In some embodiments of Formula I, at least one a1=3.
In some embodiments of Formula I, at least one a1=4.
In some embodiments of Formula I, at least one a1>0.

All of the above embodiments for a1 apply equally to a2, a3, a4, a5, and a6.

In some embodiments of Formula I, all a1-a6=0.
In some embodiments of Formula I, at least one of a1-a6 is greater than 0.
In some embodiments of Formula I, at least one of a1-a6 is greater than 0 and at least one R is D.
In some embodiments of Formula I, at least one of a1-a6 is greater than 0 and at least one R is a C1-12 alkyl or deuterated analog thereof.
In some embodiments of Formula I, at least one of a1-a6 is greater than 0 and at least one R is a C6-20 aryl or deuterated analog thereof.

In some embodiments of Formula I, $Ar^1=Ar^2$.
In some embodiments of Formula I, $Ar^1 \neq Ar^2$.

In some embodiments of Formula I, $Ar^1$ is an unsubstituted C6-20 aryl group.

In some embodiments of Formula I, $Ar^1$ is a C6-20 deuterated aryl group.

In some embodiments of Formula I, $Ar^1$ is a substituted C6-20 aryl group or deuterated analog thereof. In some embodiments, the substituent is selected from the group consisting of D, alkyl, silyl, germyl, deuterated alkyl, deuterated silyl, deuterated germyl, and combinations thereof.

In some embodiments of Formula I, $Ar^1$ is selected from the group consisting of phenyl, biphenyl, terphenyl, naphthyl, substituted derivatives thereof, and deuterated analogs thereof.

All of the above embodiments for $Ar^1$ apply equally to $Ar^2$.

In some embodiments of Formula I, the two L groups are the same.

In some embodiments of Formula I, the two L groups are different.

In some embodiments of Formula I, L is an aryl group or deuterated aryl group.

In some embodiments of Formula I, L is H or D.

In some embodiments of Formula I, c1=1.

In some embodiments of Formula I, c1=2.

In some embodiments of Formula I, c1=3.

In some embodiments of Formula I, c1=4.

In some embodiments of Formula I, c2=1.

In some embodiments of Formula I, c2=2.

In some embodiments of Formula I, c2=3.

In some embodiments of Formula I, c2=4.

In some embodiments of Formula I, c1=c2.

In some embodiments of Formula I, c1=c2=1, and the compound has Formula IA

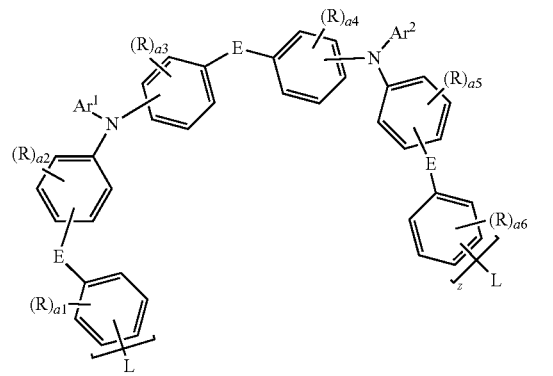

(IA)

where:
- E is the same or different at each occurrence and is selected from the group consisting of $(CR'_2)_x$, O, $(SiR'_2)_x$, $(GeR'_2)_x$, S, and Se;
- R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;
- R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;
- L is the same or different at each occurrence and is selected from the group consisting of H, D, halogen, alkyl, aryl, crosslinkable groups, deuterated alkyl, deuterated aryl, and deuterated crosslinkable groups;
- $Ar^1$ and $Ar^2$ are the same or different and are selected from the group consisting of aryl groups and deuterated analogs thereof;
- a1-a6 are the same or different and are an integer of 0-4;
- x is an integer of 1-6; and
- z is an integer greater than 0.

All of the above-described embodiments for E, R, R', L, $Ar^1$, $Ar^2$, a1-a6, x and z in Formula I apply equally to E, R, R', L, $Ar^1$, $Ar^2$, a1-a6, x and z in Formula IA.

Any of the above embodiments for Formula I and Formula IA can be combined with one or more of the other embodiments, so long as they are not mutually exclusive. For example, the embodiment in which $Ar^1$ is a substituted C6-20 aryl or deuterated analog thereof can be combined with the embodiment where at least one E is $(SiR'_2)_x$, and combined with the embodiment in which at least one of a1-a6 is greater than 0 and at least one R is a C1-12 alkyl or deuterated analog thereof. The same is true for the other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula I are shown below.

Monomer I-1

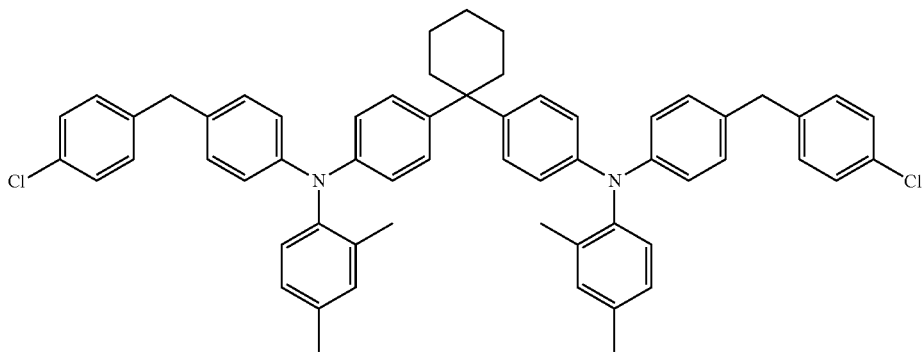

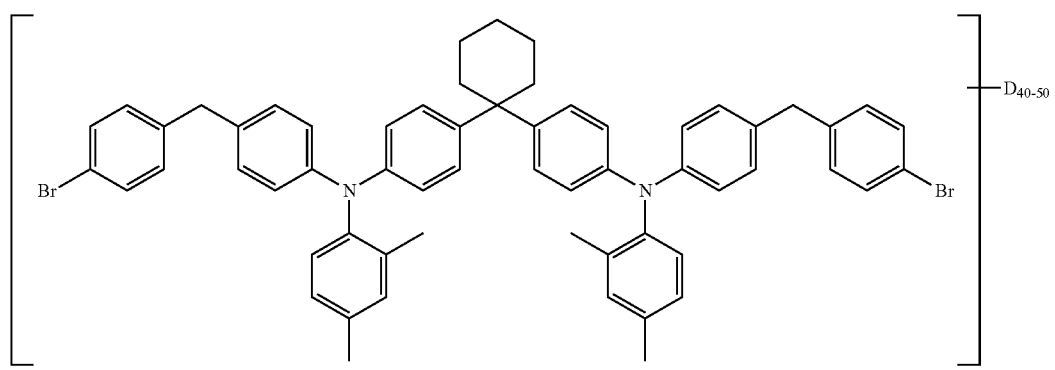
Monomer I-2
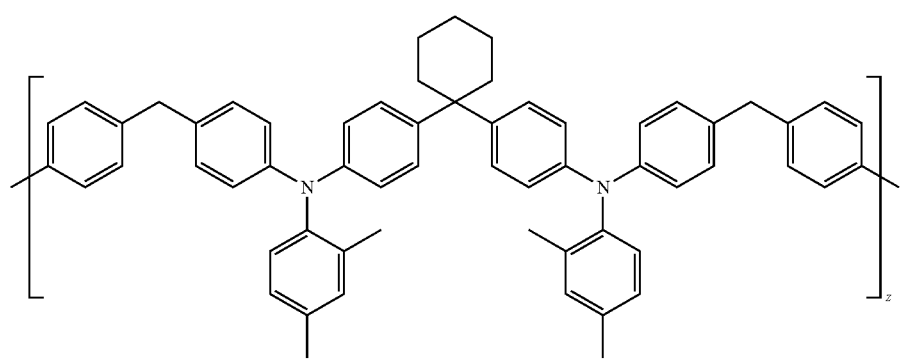
Polymer I-1
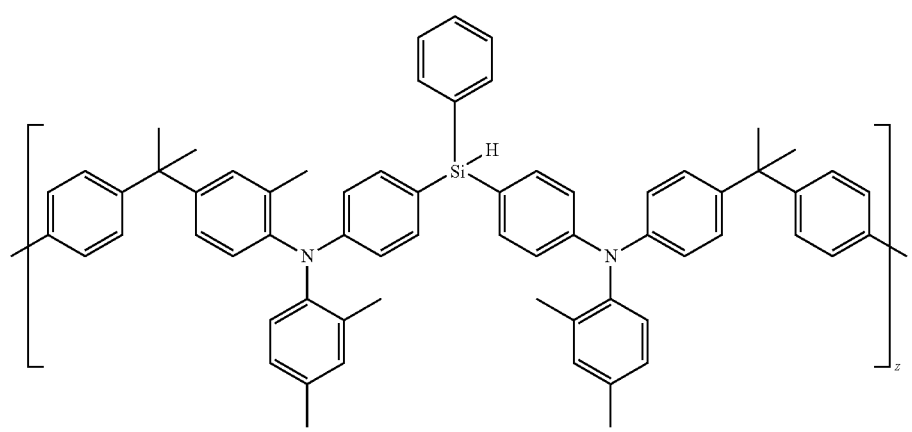
Polymer I-2
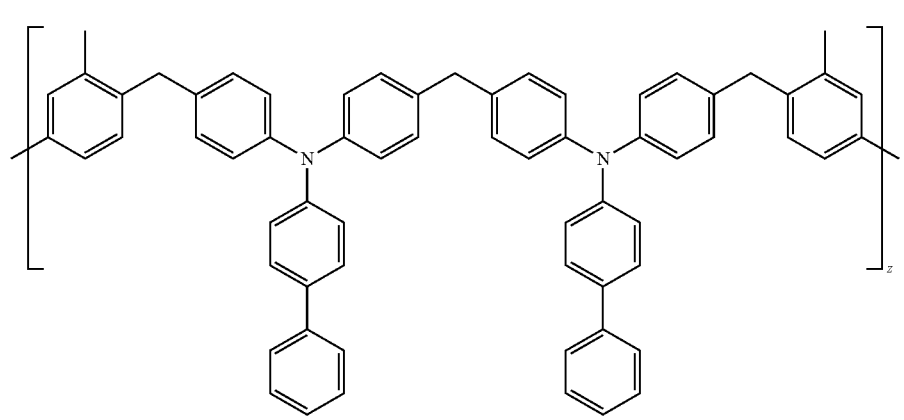
Polymer I-3

-continued

Polymer I-4

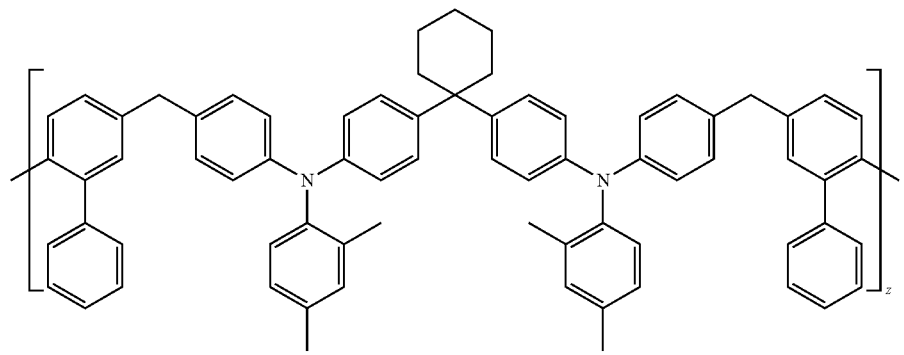

Polymer I-5

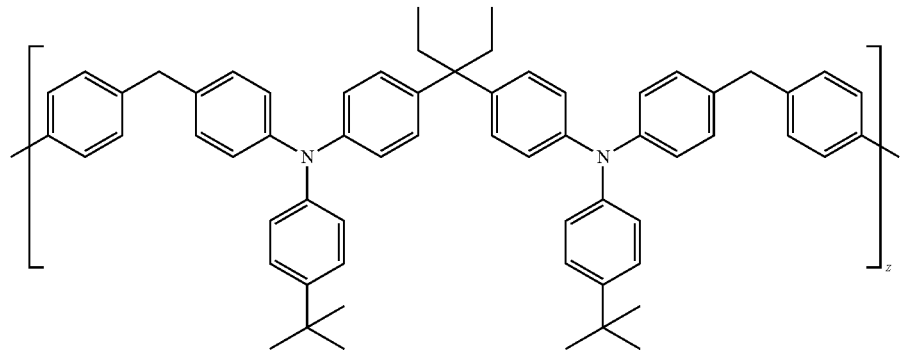

Polymer I-6

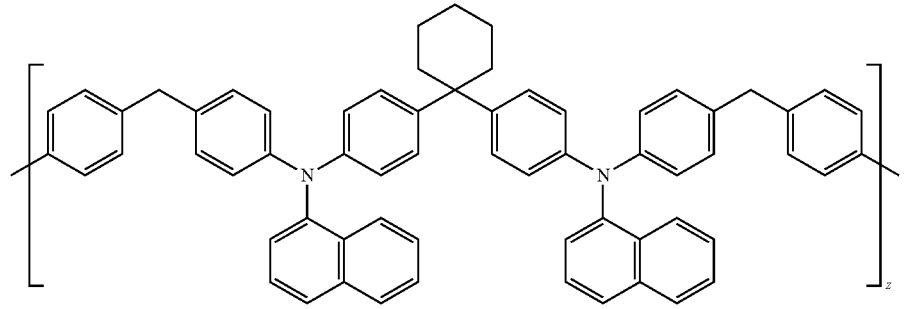

where z>5.

In some embodiments, a triarylamine compound of the invention has Formula IIA

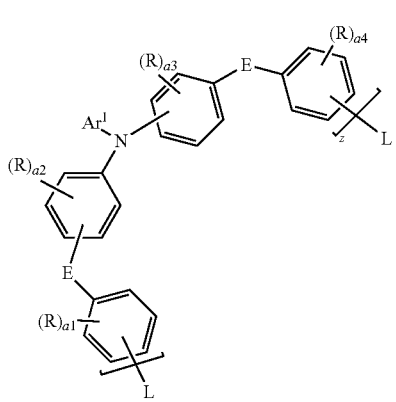

(IIA)

where:
E is the same or different at each occurrence and is selected from the group consisting of $(CR'_2)_x$, O, $(SiR'_2)_x$, $(GeR'_2)_x$, S, and Se;

R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;

R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;

L is the same or different at each occurrence and is selected from the group consisting of H, D, halogen, alkyl, aryl, crosslinkable groups, deuterated alkyl, deuterated aryl, and deuterated crosslinkable groups;

$Ar^1$ is selected from the group consisting of aryl groups and deuterated analogs thereof;

a1-a4 are the same or different and are an integer of 0-4;

x is an integer of 1-6; and z is an integer greater than 0.

In some embodiments of Formula IIA, no two adjacent R groups are joined to form a ring, and R is the same or different at each occurrence and is selected from the group consisting of D, alkyl, silyl, germyl, aryl, deuterated alkyl, deuterated silyl, deuterated germyl, and deuterated aryl.

All of the above-described embodiments for E, R, R', L, Ar¹, a1-a4, x and z in Formula I apply equally to E, R, R', L, Ar¹, a1-a4, x and z in Formula IIA.

In some embodiments, a triarylamine compound of the invention has Formula IIB

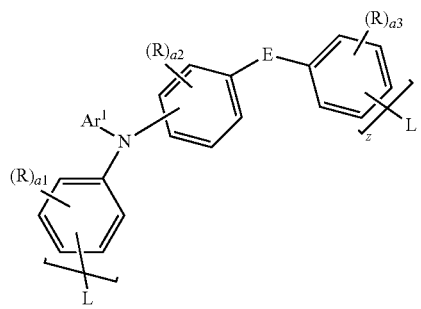

where:
- E is selected from the group consisting of $(CR'_2)_x$, O, $(SiR'_2)_x$, $(GeR'_2)_x$, S, and Se;
- R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;
- R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;
- L is the same or different at each occurrence and is selected from the group consisting of H, D, halogen, alkyl, aryl, crosslinkable groups, deuterated alkyl, deuterated aryl, and deuterated crosslinkable groups;
- Ar¹ is selected from the group consisting of aryl groups and deuterated analogs thereof;
- a1-a3 are the same or different and are an integer of 0-4;
- x is an integer of 1-6; and
- z is an integer greater than 0.

In some embodiments of Formula IIB, no two adjacent R groups are joined to form a ring, and R is the same or different at each occurrence and is selected from the group consisting of D, alkyl, silyl, germyl, aryl, deuterated alkyl, deuterated silyl, deuterated germyl, and deuterated aryl.

All of the above-described embodiments for E, R, R', L, Ar¹, a1-a3, x and z in Formula I apply equally to E, R, R', L, Ar¹, a1-a3, x and z in Formula IIB.

Any of the above embodiments for Formula IIA or Formula IIB can be combined with one or more of the other embodiments, so long as they are not mutually exclusive.

In some embodiments, a triarylamine compound of the invention has Formula III,

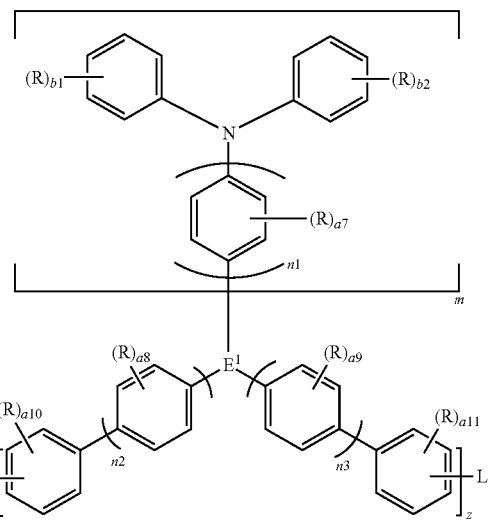

where:
- E¹=Si, Ge, PO, SiR', or GeR';
- R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;
- R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;
- L is selected from the group consisting of H, D, halogen, alkyl, aryl, crosslinkable groups, deuterated alkyl, deuterated aryl, and deuterated crosslinkable groups;
- a7-a11 are the same or different at each occurrence and are an integer of 0-4;
- b1 and b2 are the same or different and are an integer of 0-5;
- m=2 when E¹=Si, Ge;
- m=1 when E¹=PO, SiR', or GeR';
- n1, n2, and n3 are the same or different and are an integer of 0-3; and
- z is an integer greater than 0.

In some embodiments of Formula III, no two adjacent R groups are joined to form a ring, and R is the same or different at each occurrence and is selected from the group consisting of D, alkyl, silyl, germyl, aryl, deuterated alkyl, deuterated silyl, deuterated germyl, and deuterated aryl.

In some embodiments, the compound having Formula III is a small molecule with z=1.

In some embodiments, the compound having Formula III is an oligomer, with z=2-5.

In some embodiments, the compound having Formula III is a polymer, with z>5. One skilled in the art will recognize, as used herein, compounds including an illustrated formula are intended to include small molecules, oligomers and polymers.

In some embodiments of Formula III, z=1 and L is a crosslinkable group.

In some embodiments of Formula III, z=1 and L is a halogen. Such compounds can be useful as monomers for the formation of polymeric compounds. In some embodiments, the halogen is Cl or Br; in some embodiments, Br.

In some embodiments, the compound of Formula III is at least 10% deuterated. In some embodiments, the compound is at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments of Formula III, $E^1$ is Si.
In some embodiments of Formula III, $E^1$ is Ge.
In some embodiments of Formula III, $E^1$ is PO.
In some embodiments of Formula III, $E^1$ is SiR'.
In some embodiments of Formula III, $E^1$ is GeR'.
In some embodiments of Formula III, $E^1$ is selected from the group consisting of Si and Ge.
In some embodiments of Formula III, $E^1$ is selected from the group consisting of SiR' and GeR'.
In some embodiments of Formula III, n1=n2.
In some embodiments of Formula III, n1≠n2.
In some embodiments of Formula III, n1=0.
In some embodiments of Formula III, n1=1
In some embodiments of Formula III, n1=2
In some embodiments of Formula III, n1=3.
In some embodiments of Formula III, n2=0.
In some embodiments of Formula III, n2=1
In some embodiments of Formula III, n2=2
In some embodiments of Formula III, n2=3.
In some embodiments of Formula III, n3=0.
In some embodiments of Formula III, n3=1
In some embodiments of Formula III, n3=2
In some embodiments of Formula III, n3=3.
In some embodiments of Formula III, b1=0.
In some embodiments of Formula III, b1=1.
In some embodiments of Formula III, b1=2.
In some embodiments of Formula III, b1=3.
In some embodiments of Formula III, b1=4.
In some embodiments of Formula III, b1=5.
In some embodiments of Formula III, b1>0.
In some embodiments of Formula III, b2=0.
In some embodiments of Formula III, b2=1.
In some embodiments of Formula III, b2=2.
In some embodiments of Formula III, b2=3.
In some embodiments of Formula III, b2=4.
In some embodiments of Formula III, b2=5.
In some embodiments of Formula III, b2>0.

In some embodiments of Formula III, at least one of b1 and b2 is greater than 0 and at least one R is selected from the group consisting of H, D, alkyl, silyl, germyl, deuterated alkyl, deuterated silyl, deuterated and deuterated germyl.

In some embodiments of Formula III, at least one of b1 and b2 is greater than 0 and at least one R is a C1-8 alkyl or deuterated alkyl.

In some embodiments of Formula III, at least one of b1 and b2 is greater than 0 and at least one R is D.

All of the above-described embodiments for a1-a6 in Formula I apply equally to a7-a11 in Formula III.

All of the above-described embodiments for R, R', L, and z in Formula I apply equally to R, R', L, and z in Formula III.

In some embodiments of Formula III, the triarylamine compound has Formula IIIA

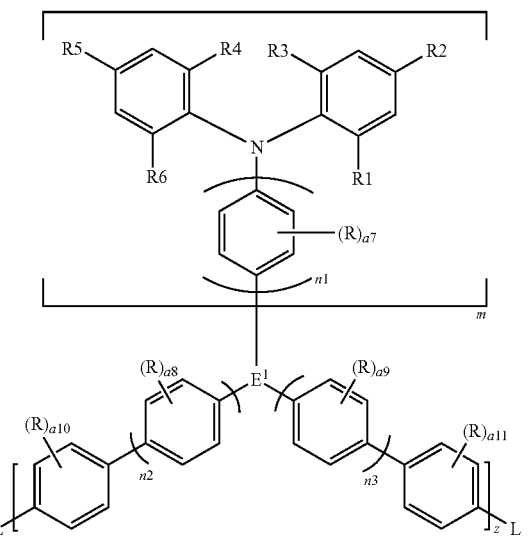

where:
$E^1$=Si, Ge, PO, SiR', or GeR';
R1-R6 are the same or different and are selected from the group consisting of H, D, C1-8 alkyl, and deuterated C1-8 alkyl;
R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;
L is selected from the group consisting of H, D, halogen, alkyl, aryl, crosslinkable groups, deuterated alkyl, deuterated aryl, and deuterated crosslinkable groups;
a7-a11 are the same or different at each occurrence and are an integer of 0-4;
m=2 when $E^1$=Si, Ge;
m=1 when $E^1$=PO, SiR', or GeR';
n1, n2, and n3 are the same or different and are an integer of 0-3; and
z is an integer greater than 0.

In some embodiments of Formula IIIA, at least one of R1-R3 is an alkyl or deuterated alkyl.

In some embodiments of Formula IIIA, at least one of R4-R6 is an alkyl or deuterated alkyl.

In some embodiments of Formula IIIA, R1 and R3 are alkyl or deuterated alkyl. In some embodiments, the alkyl or deuterated alkyl has 1-6 carbons; in some embodiments, 1-3 carbons.

In some embodiments of Formula IIIA, R4 and R6 are alkyl or deuterated alkyl. In some embodiments, the alkyl or deuterated alkyl has 1-6 carbons; in some embodiments, 1-3 carbons.

In some embodiments of Formula IIIA, R1 and R2 are alkyl or deuterated alkyl.

In some embodiments of Formula IIIA, R4 and R5 are alkyl or deuterated alkyl.

In some embodiments of Formula IIIA, at least one of R1-R3 is H or D.

In some embodiments of Formula IIIA, at least one of R4-R6 is H or D.

All of the above-described embodiments for $E^1$, R, L, a7-a11, m, n1-n3, and z in Formula III apply equally to $E^1$, R, L, a7-a11, m, n1-n3, and z in Formula IIIA.

Any of the above embodiments for Formula III or Formula IIIA can be combined with one or more of the other embodiments, so long as they are not mutually exclusive.

Some non-limiting examples of compounds having Formula III are shown below.
Monomer III-1
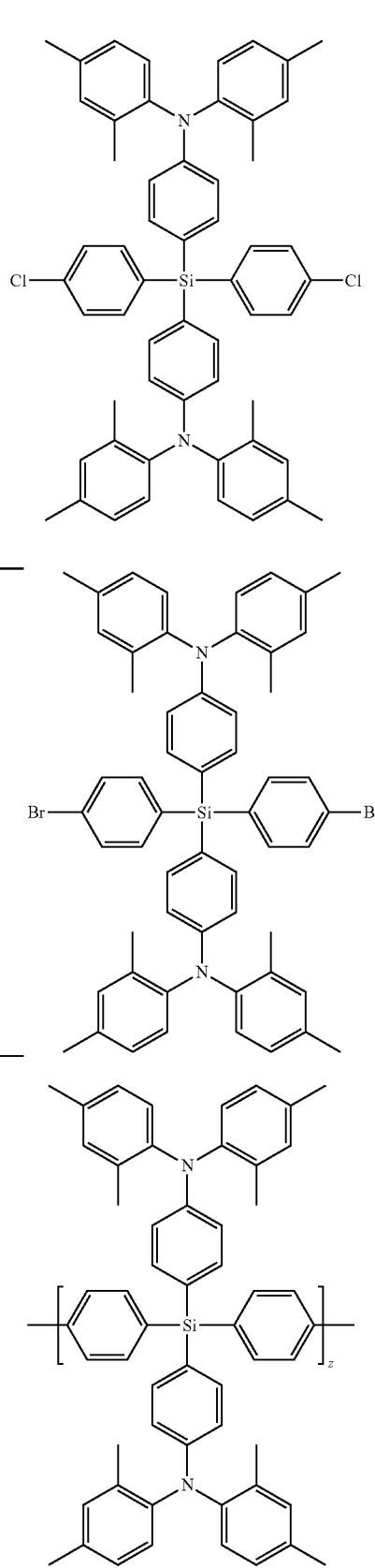
Polymer III-1
Polymer III-2
Polymer III-3
Polymer III-4
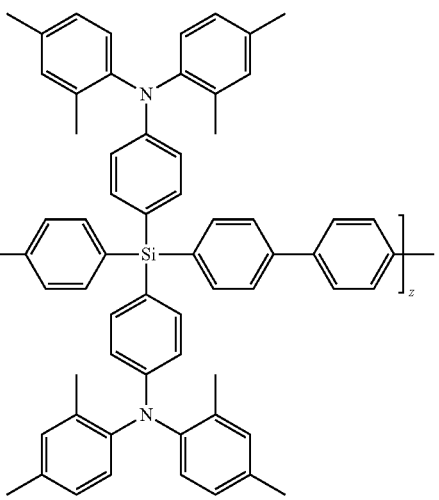
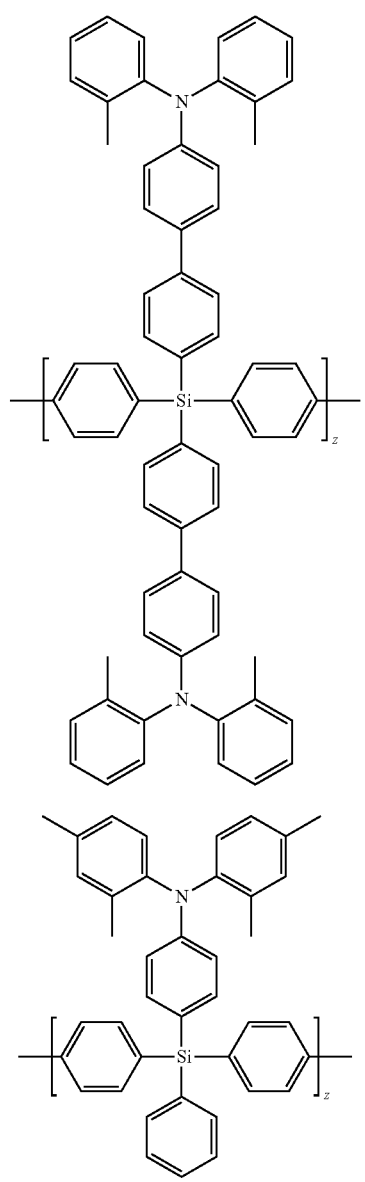

Polymer III-5

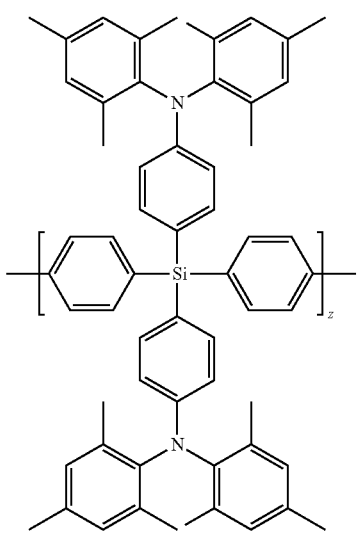

Polymer III-6

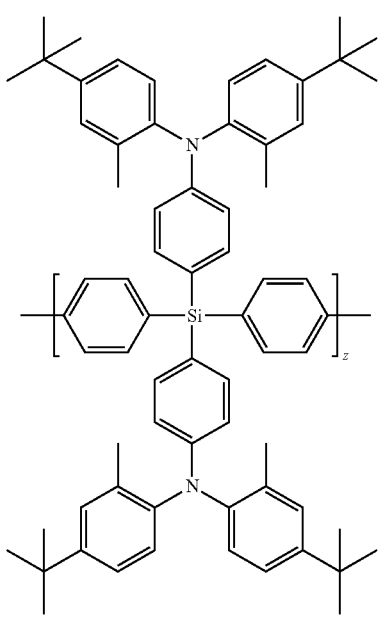

The triarylamine compounds of the present invention can be made using any technique that will yield a C—C or C—N bond and known polymerization techniques. A variety of such techniques are known, such as Suzuki, Yamamoto, Stille, and metal-catalyzed C—N couplings as well as metal catalyzed and oxidative direct arylation.

Deuterated compounds can be prepared in a similar manner using deuterated precursor materials or, more generally, by treating the non-deuterated compound with deuterated solvent, such as benzene-d6, in the presence of a Lewis acid H/D exchange catalyst, such as trifluoromethanesulfonic acid, aluminum trichloride or ethyl aluminum dichloride.

3. Copolymers

The copolymers of the present invention have at least one monomeric unit of Formula I-m, Formula IA-m, Formula IIA-m, Formula IIB-m, Formula III-m, or Formula IIIA-m

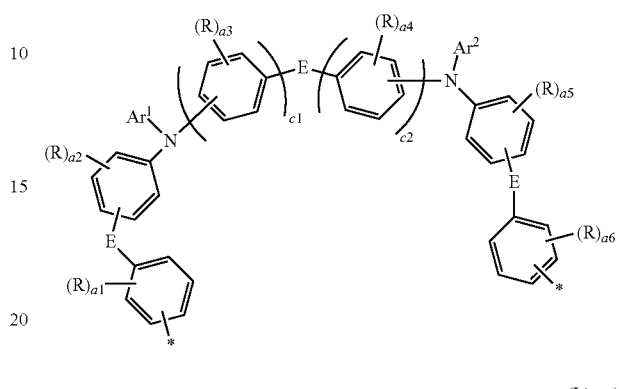

(I-m)

(IA-m)

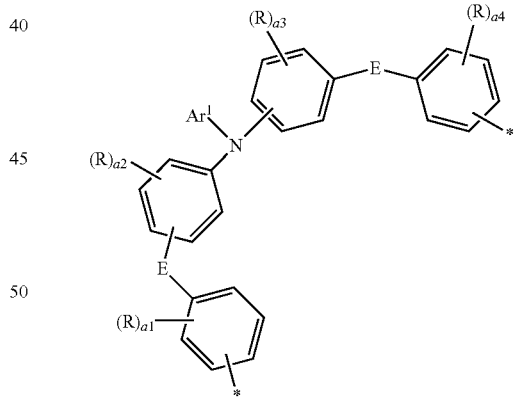

(IIA-m)

(IIB-m)

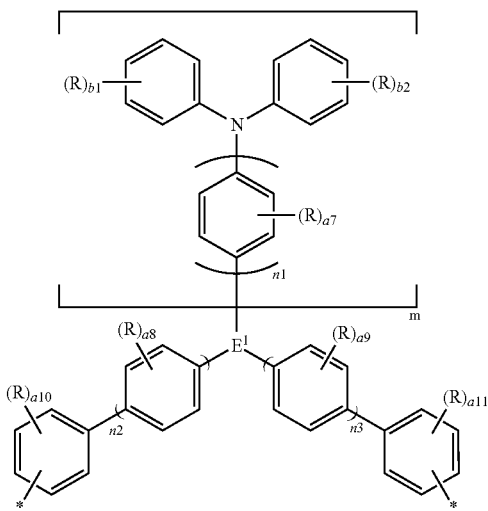

(III-m)

where:
E is the same or different at each occurrence and is selected from the group consisting of $(CR'_2)_x$, O, $(SiR'_2)_x$, $(GeR'_2)_x$, S, and Se;

$E^1$ is selected from the group consisting of Si, Ge, PO, SiR', and GeR';

R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;

R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;

R1-R6 are the same or different and are selected from the group consisting of H, D, C1-8 alkyl, and deuterated C1-8 alkyl;

$Ar^1$ and $Ar^2$ are the same or different and are selected from the group consisting of aryl groups and deuterated analogs thereof;

a1-a11 are the same or different at each occurrence and are an integer of 0-4;

b1 and b2 are the same or different and are an integer of 0-5;

c1 and c2 are the same or different and are an integer of 1-4;

m=2 when $E^1$=Si, Ge;

m=1 when $E^1$=PO, SiR', or GeR';

n1, n2, and n3 are the same or different and are an integer of 0-3;

x is an integer of 1-6; and

* represents a point of attachment in the copolymer.

In some embodiments of Formula I-m, Formula IA-m, Formula IIA-m, Formula IIB-m, Formula III-m, and Formula IIIA-m, no two adjacent R groups are joined to form a ring, and R is the same or different at each occurrence and is selected from the group consisting of D, alkyl, silyl, germyl, aryl, deuterated alkyl, deuterated silyl, deuterated germyl, and deuterated aryl.

All of the above-described embodiments for E, R, R', $Ar^1$, $Ar^2$, a1-a6, and x in Formula I apply equally to E, R, R', $Ar^1$, $Ar^2$, a1-a6, c1, c2, and x in Formula I-m.

All of the above-described embodiments for E, R, R', $Ar^1$, $Ar^2$, a1-a6, and x in Formula IA apply equally to E, R, R', $Ar^1$, $Ar^2$, a1-a6, and x in Formula IA-m.

All of the above-described embodiments for E, R, R', $Ar^1$, a1-a4, and x in Formula IIA apply equally to E, R, R', $Ar^1$, a1-a4, and x in Formula IIA-m.

All of the above-described embodiments for E, R, R', $Ar^1$, a1-a3, and x in Formula IIB apply equally to E, R, R', $Ar^1$, a1-a3, and x in Formula IIB-m.

All of the above-described embodiments for $E^1$, R, R', a7-a11, b1 and b2 in Formula III apply equally to $E^1$, R, R', a7-a11, b1, and b2 in Formula III-m.

All of the above-described embodiments for $E^1$, R, R', R1-R6, a7-a11, m, and n1-n3 in Formula IIIA apply equally to $E^1$, R, R', R1-R6, a7-a11, m, and n1-n3 in Formula IIIA-m.

Any of the above embodiments for Formula I-m, Formula IA-m, Formula IIA-m, Formula IIB-m, Formula III-m, or Formula IIIA-m can be combined with one or more of the other embodiments, so long as they are not mutually exclusive.

In some embodiments, the copolymer has Formula IV

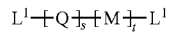

Formula IV where:
$L^1$ is the same or different at each occurrence and is selected from the group consisting of H, D, halogen, aryl, arylamino, crosslinkable groups, deuterated aryl, deuterated arylamino, and deuterated crosslinkable groups;

M is a conjugated moiety;

Q is a monomeric unit having Formula I-m, Formula IA-m, Formula IIA-m, Formula IIB-m, Formula III-m, or Formula IIIA-m; and s and t represent non-zero mole fractions, such that s+t=1.

In Formula IV, the "Q" and "M" units can be ordered in a regular alternating pattern, in blocks of like monomers, or randomly arranged.

In some embodiments of Formula IV, $L^1$ is selected from aryl, arylamino, crosslinkable groups, and deuterated analogs thereof. In some embodiments of Formula IV, $L^1$ is selected from phenyl, biphenyl, triphenylamino, and deuterated analogs thereof.

In some embodiments of Formula IV, Q has Formula I-m.

In some embodiments of Formula IV, Q has Formula IA-m.

In some embodiments of Formula IV, Q has Formula IIA-m.

In some embodiments of Formula IV, Q has Formula IIB-m.

In some embodiments of Formula IV, Q has Formula III-m.

In some embodiments of Formula IV, Q has Formula IIIA-m.

In some embodiments of Formula IV, M has Formula I-m, Formula IA-m, Formula IIA-m, Formula IIB-m, Formula III-m, or Formula IIIA-m, provided that M≠Q.

In some embodiments of Formula IV, M is a deuterated aromatic moiety.

In some embodiments of Formula IV, M is a monomeric unit derived from an olefin, an acetylenic compound, a styrene, a stilbene, a substituted derivative thereof, or a deuterated analog thereof.

In some embodiments of Formula IV, M is a monomeric unit derived from a hydrocarbon aryl having two or more fused rings, a substituted derivative thereof, or a deuterated analog thereof.

In some embodiments of Formula IV, M is a monomeric unit derived from the group consisting of naphthalene, anthracene, fluorene, phenanthrene, triphenylene, substituted derivatives thereof, and deuterated analogs thereof.

In some embodiments of Formula IV, M is a monomeric unit derived from a triarylamino group or deuterated analog thereof.

In some embodiments of Formula IV, M is a monomeric unit derived from a heteroaromatic compound having at least one ring atom which is selected from the group consisting of N, O, and S.

In some embodiments of Formula IV, M is a monomeric unit derived from an N-heteroaryl.

In some embodiments of Formula IV, M is a monomeric unit derived from an S-heteroaryl.

In some embodiments of Formula IV, M is a monomeric unit derived from an O-heteroaryl.

In some embodiments of Formula IV, M is a monomeric unit derived from an N,O-heteroaryl.

In some embodiments of Formula IV, M is a monomeric unit derived from an N,S-heteroaryl.

In some embodiments of Formula IV, M has one of the formulae given below.

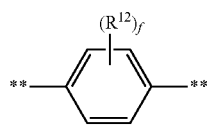

M1

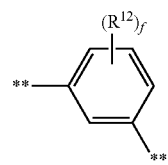

M2

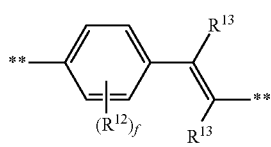

M3

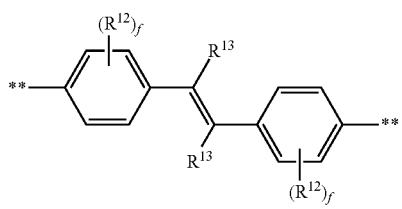

M4

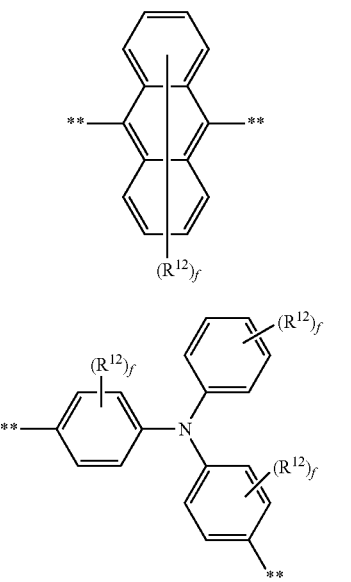

M5

M6

M7

M8

M9

M10

M11
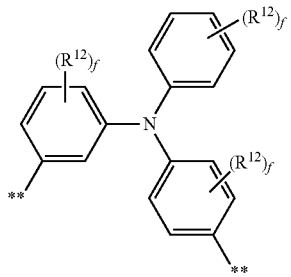

M12
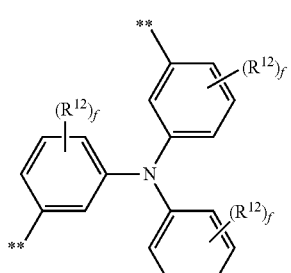

M13
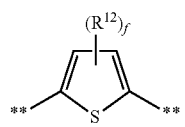

M14
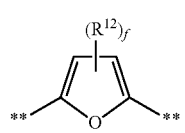

M15
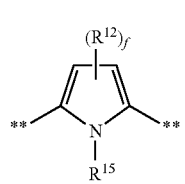

M16
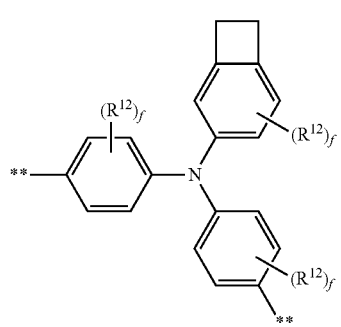

M17
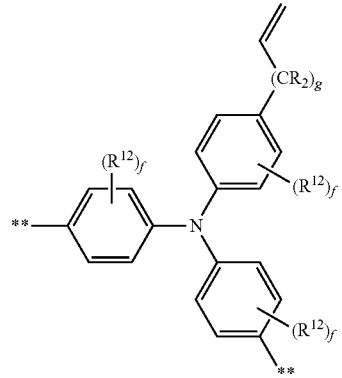

M18
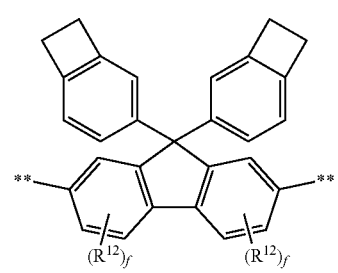

M19
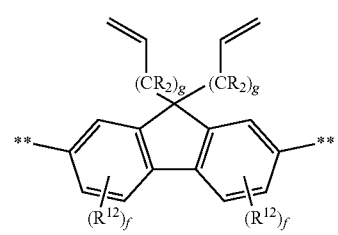

M20
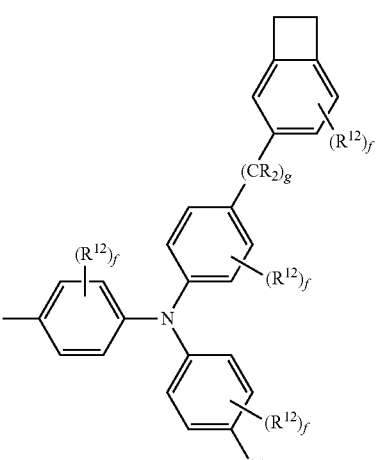

In M1 through M20:

$R^{12}$ is the same or different at each occurrence and is selected from the group consisting of D, alkyl, silyl, aryl, deuterated alkyl, deuterated silyl, and deuterated aryl;

$R^{13}$ is the same or different at each occurrence and is selected from the group consisting of H, D, alkyl, and deuterated alkyl;

$R^{14}$ is the same or different at each occurrence and is selected from the group consisting of alkyl, aryl, and deuterated analogs thereof;

$R^{15}$ is the same or different at each occurrence and is selected from the group consisting of aryl and deuterated aryl;

f is the same or different at each occurrence and is an integer from 0 to the maximum number of positions available for substituents;

g is an integer of 0-20; and

** represents the point of attachment in the copolymer.

In some embodiments of M1 through M20, f is 0-2.

In some embodiments of Formula IV, s is in the range of 0.5-0.99; in some embodiments, 0.6-0.90; in some embodiments, 0.75-0.85.

Any of the above embodiments for Formula IV can be combined with one or more of the other embodiments, so long as they are not mutually exclusive.

The copolymer having Formula IV can be made using known coupling techniques and polymerization techniques.

In some embodiments, the triarylamine compound has Formula I, Formula IA, Formula III, or Formula IIIA.

In some embodiments, the triarylamine is a copolymer having at least one monomeric unit having Formula I-m, Formula IA-m, Formula III-m, or Formula IIIA-m.

In some embodiments, the triarylamine compound has Formula IA, or Formula IIIA.

In some embodiments, the triarylamine is a copolymer having at least one monomeric unit having Formula IA-m, or Formula IIIA-m.

4. Electronic Device

Organic electronic devices that may benefit from having one or more layers including at least one triarylamine as described herein include, but are not limited to, (1) devices that convert electrical energy into radiation (e.g., a light-emitting diode, light emitting diode display, lighting device, luminaire, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), (4) devices that convert light of one wavelength to light of a longer wavelength, (e.g., a down-converting phosphor device); and (5) devices that include one or more electronic components that include one or more organic semi-conductor layers (e.g., a transistor or diode). Other uses for the compositions according to the present invention include coating materials for memory storage devices, antistatic films, biosensors, electrochromic devices, solid electrolyte capacitors, energy storage devices such as a rechargeable battery, and electromagnetic shielding applications.

One illustration of an organic electronic device structure which can utilize the new triarylamine described herein is shown in FIG. 1. The device 100 has a first electrical contact layer, an anode layer 110 and a second electrical contact layer, a cathode layer 160, and a photoactive layer 140 between them. Additional layers may optionally be present. Adjacent to the anode may be a hole injection layer 120, sometimes referred to as a buffer layer. Adjacent to the hole injection layer may be a hole transport layer 130, including hole transport material. Adjacent to the cathode may be an electron transport layer 150, including an electron transport material. As an option, devices may use one or more additional hole injection or hole transport layers (not shown) next to the anode 110 and/or one or more additional electron injection or electron transport layers (not shown) next to the cathode 160. Layers 120 through 150 are individually and collectively referred to as the organic active layers.

Figure 2:
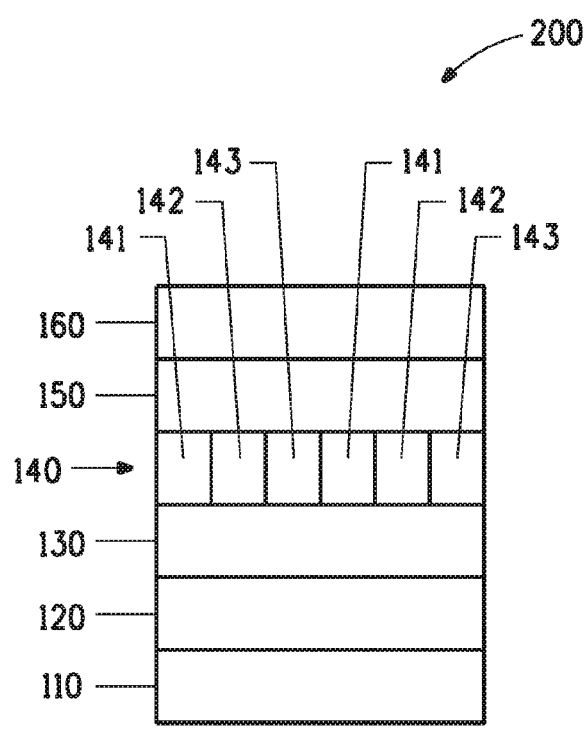
FIG. 2 includes a schematic diagram of another example of an organic electronic device including a compound of the invention.

In some embodiments, in order to achieve full color, the light-emitting layer is pixellated, with subpixel units for each of the different colors. An illustration of a pixellated device which can utilize the new triarylamine described herein is shown in FIG. 2. The device 200 has anode 110, hole injection layer 120, hole transport layer 130, photoactive layer 140, electron transport layer 150, and cathode 160. The photoactive layer is divided into subpixels 141, 142, 143, which are repeated across the layer. In some embodiments, the subpixels represent red, blue and green color emission. Although three different subpixel units are depicted in FIG. 2, two or more than three subpixel units may be used.

The different layers will be discussed further herein with reference to FIG. 1. However, the discussion applies to FIG. 2 and other configurations as well.

In some embodiments, the different layers have the following range of thicknesses: anode 110, 500-5000 Å, in some embodiments, 1000-2000 Å; hole injection layer 120, 50-2000 Å, in some embodiments, 200-1000 Å; hole transport layer 130, 50-3000 Å, in some embodiments, 200-2000 Å; photoactive layer 140, 10-2000 Å, in some embodiments, 100-1000 Å; electron transport layer 150, 50-2000 Å, in some embodiments, 100-1000 Å; cathode 160, 200-10000 Å, in some embodiments, 300-5000 Å. The desired ratio of layer thicknesses will depend on the exact nature of the materials used.

Depending upon the application of the device 100, the photoactive layer 140 can be a light-emitting layer that is activated by an applied voltage (such as in a light-emitting diode or light-emitting electrochemical cell), or a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are described in Markus, John, *Electronics and Nucleonics Dictionary*, 470 and 476 (McGraw-Hill, Inc. 1966).

The triarylamine compounds and copolymers described herein have particular utility in organic light-emitting diodes ("OLEDs"). In OLEDs, the light-emitting material is frequently an organometallic compound containing a heavy atom such as Ir, Pt, Os, Rh, and the like. The lowest excited state of these organometallic compounds often possesses mixed singlet and triplet character (Yersin, Hartmut; Finkenzeller, Walter J., Triplet emitters for organic light-emitting diodes: basic properties. Highly Efficient OLEDs with Phosphorescent Materials (2008)). Because of the triplet character, the excited state can transfer its energy to the triplet state of a nearby molecule, which may be in the same or an adjacent layer. This results in luminescence quenching. To prevent such luminescence quenching in an OLED device, the triplet state energy of the material used in various layers of the OLED device has to be comparable or higher than the lowest excited state energy of the organometallic emitter. For example, it has been demonstrated that for the green emitter Ir(ppy)$_3$, the use of NPB (N,N"-diphenyl-N,N"-bis(1-naphthyl)-1,1"-biphenyl-4,4"-diamine) as the hole transport layer resulted in luminance quenching due to the low triplet state energy of NPB (Y. Wang, Appl. Phys. Lett., 85, 4848 (2004)). It should be noted that the excited state energy of an organometallic emitter can be determined from the 0-0 transition in the luminance spectrum, which is typically at higher energy than the luminance peak.

If the recombination zone in the emissive layer of the OLED device is located on the hole transport side, then the exciton luminance is more sensitive to the triplet energy of the hole transport layer used. Conversely, if the recombination zone is located on the electron transport side, the exciton luminance is more sensitive to the triplet energy of the electron transport layer used. The exciton luminance tends to be most sensitive to the triplet energy of the host material.

In some embodiments, the organic electronic device comprises a first electrical contact layer, a second electrical contact layer, and at least one active layer therebetween, wherein the active layer comprises a triarylamine described herein. In some embodiments the active layer comprises a compound having Formula I, Formula IA, Formula IIA, Formula IIB, Formula III, or Formula IIIA. In some embodiments, the active layer comprises a copolymer having at least one monomeric unit having Formula I-m, Formula IA-m, Formula IIA-m, Formula IIB-m, Formula III-m, or Formula IIIA-m. In some embodiments, the active layer is the hole transport layer 130. In some embodiments, the active layer is the photoactive layer 140.

In some embodiments, the organic electronic device comprises a first electrical contact layer, a second electrical contact layer, and at least one active layer therebetween, wherein the active layer comprises a triarylamine described herein and an organometallic compound capable of electroluminescence having an emission maximum between 380 and 750 nm. In some embodiments the triarylamine is a compound having Formula I, Formula IA, Formula IIA, Formula IIB, Formula III, or Formula IIIA. In some embodiments, the triarylamine is a copolymer having at least one monomeric unit having Formula I-m, Formula IA-m, Formula IIA-m, Formula IIB-m, Formula III-m, or Formula IIIA-m.

In some embodiments, the organic electron device comprises an anode, a first electroactive layer, a second electroactive layer, and a cathode, wherein the first electroactive layer is a hole transport layer and the second electroactive layer is a photoactive layer. In some embodiments, the hole transport layer comprises a triarylamine as described herein and the electroluminescent layer comprises a triarylamine as described herein and an organometallic compound capable of electroluminescence having an emission maximum between 380 and 750 nm.

a. Hole Transport Layer

In some embodiments, the hole transport layer comprises a compound having Formula I, Formula IA, Formula IIA, Formula IIB, Formula III, or Formula IIIA, or a copolymer having at least one monomeric unit having Formula I-m, Formula IA-m, Formula IIA-m, Formula IIB-m, Formula III-m, or Formula IIIA-m. The triarylamine layer may be formed by any deposition method, including vapor deposition, liquid deposition, and thermal transfer.

In some embodiments, the hole transport layer consists essentially of a compound having Formula I, Formula IA, Formula IIA, Formula IIB, Formula III, or Formula IIIA, or a copolymer having at least one monomeric unit having Formula I-m, Formula IA-m, Formula IIA-m, Formula IIB-m, Formula III-m, or Formula IIIA-m, where additional substances that would materially alter the principle of operation or the distinguishing characteristics of the composition are not present therein.

In some embodiments, the hole transport layer comprises a different hole transport material. Examples of other hole transport materials for layer 130 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N, N'-bis(4-methylphenyl)-N,N-bis(4-ethylphenyl)-[1,1'-(3,3'-dimethyl)biphenyl]-4,4'-diamine (ETPD), tetrakis-(3-methylphenyl)-N, N, N',N'-2,5-phenylenediamine (PDA), a-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3[p-(diethylamino)styryl]-5-[p-(diethylamino)phenyl]pyrazoline (PPR or DEASP), 1,2-trans-bis (9H-carbazol-9-yl)cyclobutane (DCZB), N,N,N',N'-tetrakis (4-methylphenyl)-(1,1'-biphenyl)-4,4'-diamine (TTB), N,N'-bis(naphthalen-1-yl)-N,N'-bis-(phenyl)benzidine (□-NPB), and porphyrinic compounds, such as copper phthalocyanine. Commonly used hole transporting polymers are polyvinylcarbazole, (phenylmethyl)-polysilane, and polyaniline. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

b. Photoactive Layer

In some embodiments, the triarylamine compounds described herein function as a host for an electroluminescent material in an electroactive composition in photoactive layer 140.

In some embodiments, the electroactive composition comprises (a) a triarylamine host which is a compound having Formula I, Formula IA, Formula IIA, Formula IIB, Formula III, or Formula IIIA, or a copolymer having at least one monomeric unit having Formula I-m, Formula IA-m, Formula IIA-m, Formula IIB-m, Formula III-m, or Formula IIIA-m, and (b) an organometallic dopant capable of electroluminescence having an emission maximum between 380 and 750 nm. In some embodiments, the electroactive composition further comprises (c) a second host material.

In some embodiments, the electroactive composition consists essentially of (a) a triarylamine host which is a compound having Formula I, Formula IA, Formula IIA, Formula IIB, Formula III, or Formula IIIA, or a copolymer having at least one monomeric unit having Formula I-m, Formula IA-m, Formula IIA-m, Formula IIB-m, Formula III-m, or Formula IIIA-m, and (b) an organometallic dopant capable of electroluminescence having an emission maximum between 380 and 750 nm, where additional substances that would materially alter the principle of operation or the distinguishing characteristics of the composition are not present therein.

In some embodiments, the electroactive composition consists essentially of (a) a triarylamine host which is a compound having Formula I, Formula IA, Formula IIA, Formula IIB, Formula III, or Formula IIIA, or a copolymer having at least one monomeric unit having Formula I-m, Formula IA-m, Formula IIA-m, Formula IIB-m, Formula III-m, or Formula IIIA-m, (b) an organometallic dopant capable of electroluminescence having an emission maximum between 380 and 750 nm, and (c) a second host material, where additional substances that would materially alter the principle of operation or the distinguishing characteristics of the composition are not present therein.

The new triarylamine compounds and copolymers can be used as a host for dopants with any color of emission. In some embodiments, the new triarylamine compounds are used as hosts for electroluminescent materials having an emission color ranging from green to blue.

Examples of other host materials include, but are not limited to, chrysenes, phenanthrenes, triphenylenes, phenanthrolines, naphthalenes, anthracenes, quinolines, isoquinolines, quinoxalines, phenylpyridines, benzodifurans, indolocarbazoles, indoloindoles, and metal quinolinate complexes.

The amount of dopant present in the electroactive composition is generally in the range of 3-20% by weight, based on the total weight of the composition; in some embodiments, 5-15% by weight.

When a second host is present, the ratio of triarylamine host compound having Formula I, Formula IA, Formula IIA, Formula IIB, Formula III, or Formula IIIA, or copolymer having at least one monomeric unit having Formula I-m, Formula IA-m, Formula IIA-m, Formula IIB-m, Formula III-m, or Formula IIIA-m to second host is generally in the range of 1:20 to 20:1; in some embodiments, 5:15 to 15:5. In some embodiments, the triarylamine host described herein is at least 50% by weight of the total host material; in some embodiments, at least 70% by weight.

The dopant is an electroactive material which is capable of electroluminescence having an emission maximum between 380 and 750 nm. In some embodiments, the dopant emits red, green, or blue light. Examples of red light-emitting materials include, but are not limited to, cyclometalated complexes of Ir having phenylquinoline or phenylisoquinoline ligands, periflanthenes, fluoranthenes, and perylenes. Red light-emitting materials have been disclosed in, for example, U.S. Pat. No. 6,875,524, and published US application 2005-0158577. Examples of green light-emitting materials include, but are not limited to, cyclometalated complexes of Ir having phenylpyridine ligands, diaminoanthracenes, and polyphenylenevinylene polymers. Green light-emitting materials have been disclosed in, for example, published PCT application WO 2007/021117. Examples of blue light-emitting materials include, but are not limited to, diarylanthracenes, diaminochrysenes, diaminopyrenes, cyclometalated complexes of Ir having phenylpyridine ligands, and polyfluorene polymers. Blue light-emitting materials have been disclosed in, for example, U.S. Pat. No. 6,875,524, and published US applications 2007-0292713 and 2007-0063638.

In some embodiments, the dopant is an organometallic complex. In some embodiments, the dopant is a cyclometalated complex of iridium or platinum. Such materials have been disclosed in, for example, U.S. Pat. No. 6,670,645 and Published PCT Applications WO 03/063555, WO 2004/016710, and WO 03/040257.

In some embodiments, the dopant is a complex having the formula $Ir(LG1)_x(LG2)_y(LG3)_z$; where
LG1 is a monoanionic bidentate cyclometalating ligand coordinated through carbon and nitrogen;
LG2 is a monoanionic bidentate ligand which is not coordinated through a carbon;
LG3 is a monodentate ligand;
x is 1-3;
y and z are independently 0-2;
and x, y, and z are selected such that the iridium is hexacoordinate and the complex is electrically neutral.

Some examples of formulae include, but are not limited to, $Ir(LG1)_3$; $Ir(LG1)_2(LG2)$; and $Ir(LG1)_2(LG3)(LG3')$, where LG3 is anionic and LG3' is nonionic.

In some embodiments, LG1 has a structure in which an N-heterocyclic ring is bonded to a second aromatic ring, as shown schematically below.

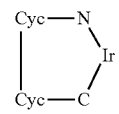

Examples of N-heterocyclic rings include, but are not limited to, pyridine, quinoline, isoquinoline, diazines, pyrazoles, and triazines. Examples of the second aromatic ring include, but are not limited to, phenyl, pyrrole, thiophene, and pyridine. The N-heterocyclic and second aromatic rings may have one or more substituents selected from the group consisting of D, halide (especially F), alkyl, alkoxy, aryl aryloxy, silyl, arylamino, and cyano.

Examples of LG1 ligands include, but are not limited to phenylpyridines, phenylquinolines, phenylpyrimidines, phenylpyrazoles, thienylpyridines, thienylquinolines, thienylpyrimidines, and 1,7-phenanthroline. As used herein, the term "quinolines" includes "isoquinolines" unless otherwise specified. These ligands may have substituents as discussed above.

Monoanionic bidentate ligands, LG2, are well known in the art of metal coordination chemistry. In general these ligands have N, O, P, or S as coordinating atoms and form 5- or 6-membered rings when coordinated to the iridium. Suitable coordinating groups include amino, imino, amido, alkoxide, carboxylate, phosphino, thiolate, and the like. Examples of suitable parent compounds for these ligands include β-dicarbonyls (β-enolate ligands), and their N and S analogs; amino carboxylic acids (aminocarboxylate ligands); pyridine carboxylic acids (iminocarboxylate ligands); salicylic acid derivatives (salicylate ligands); hydroxyquinolines (hydroxyquinolinate ligands) and their S analogs; and phosphinoalkanols (phosphinoalkoxide ligands).

In some embodiments, LG2 is selected from the group consisting of

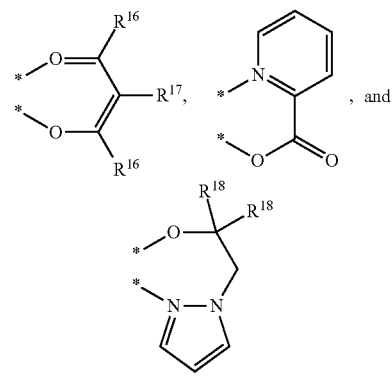

where:
$R^{16}$ is the same or different at each occurrence and is selected from the group consisting of alkyl and fluoroalkyl;
$R^{17}$ is H, D or F;

$R^{18}$ is the same or different at each occurrence and is selected from the group consisting of alkyl and fluoroalkyl; and

* represents a point of coordination with Ir.

Monodentate ligand LG3 can be anionic or nonionic. Anionic ligands include, but are not limited to, H— ("hydride") and ligands having C, O or S as coordinating atoms. Coordinating groups include, but are not limited to alkoxide, carboxylate, thiocarboxylate, dithiocarboxylate, sulfonate, thiolate, carbamate, dithiocarbamate, thiocarbazone anions, sulfonamide anions, and the like. In some cases, ligands listed above as LG2, such as β-enolates and phosphinoakoxides, can act as monodentate ligands. The monodentate ligand can also be a coordinating anion such as halide, cyanide, isocyanide, nitrate, sulfate, hexahaloantimonate, and the like. These ligands are generally available commercially.

The monodentate LG3 ligand can also be a non-ionic ligand, such as CO or a monodentate phosphine ligand.

In some embodiments, one or more of the ligands has at least one substituent selected from the group consisting of F and fluorinated alkyls.

The iridium complex dopants can be made using standard synthetic techniques as described in, for example, U.S. Pat. No. 6,670,645.

Some non-limiting examples of iridium complex dopants having green emission are given below.

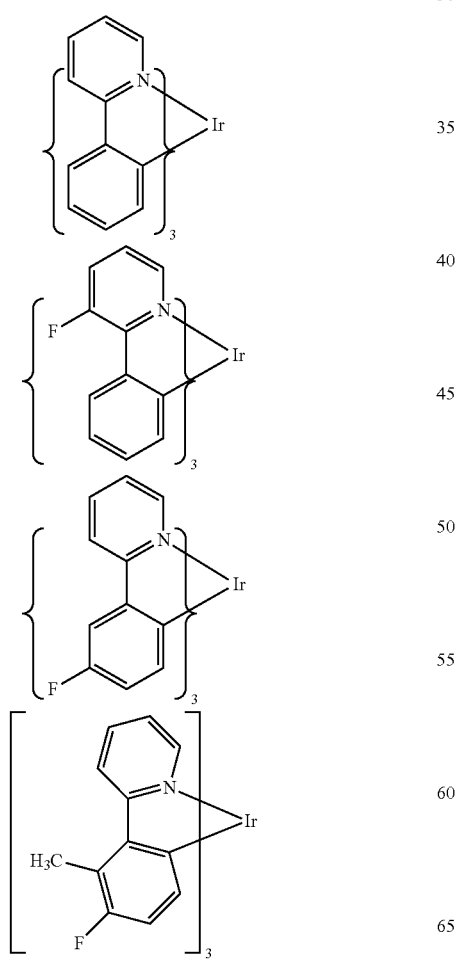

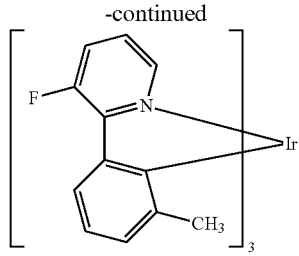

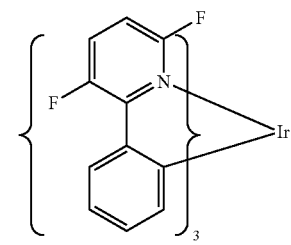

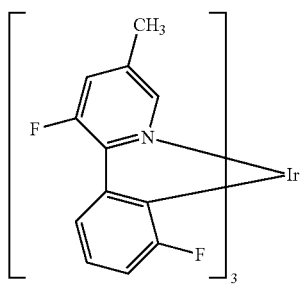

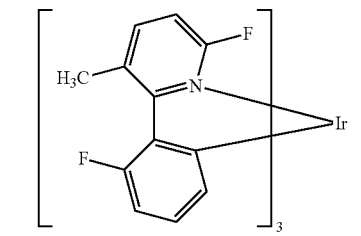

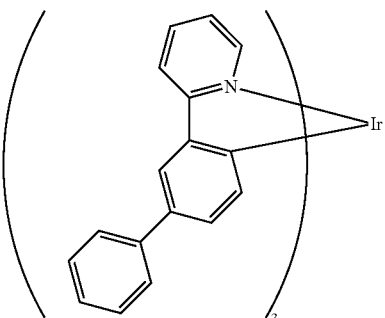

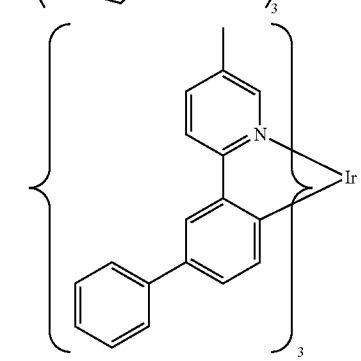

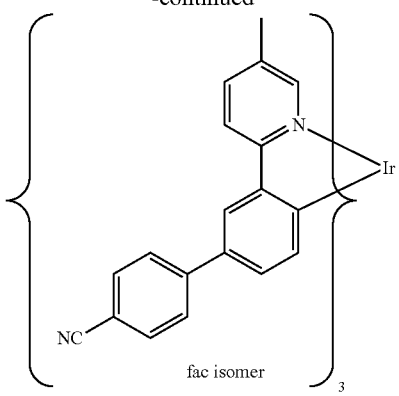
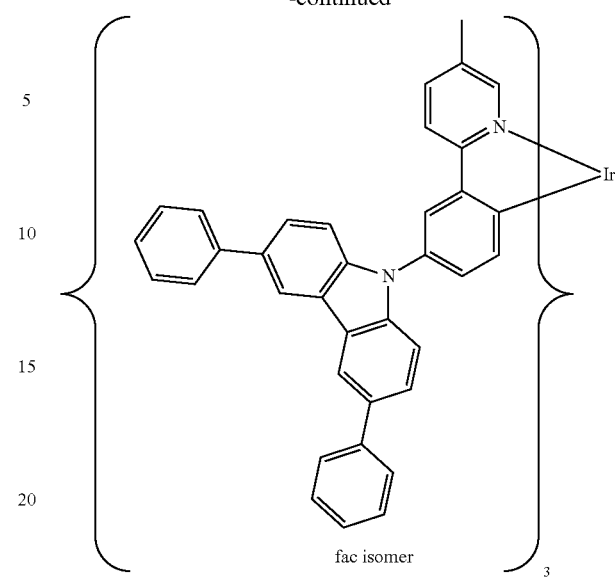
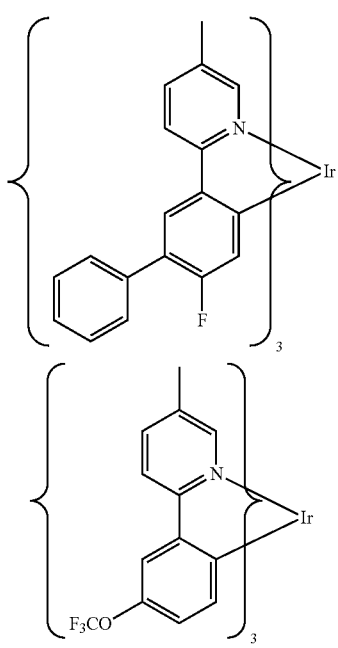
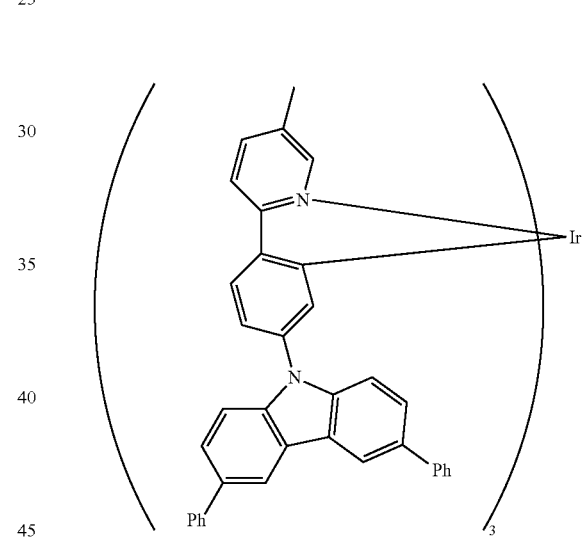
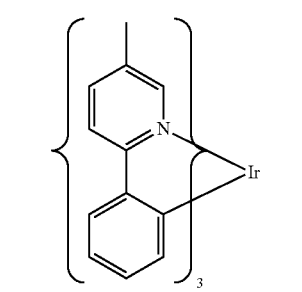
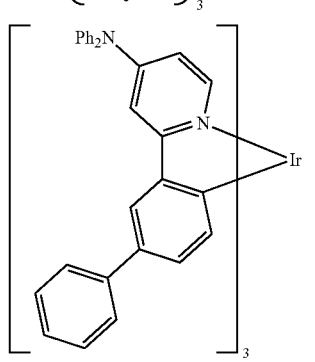
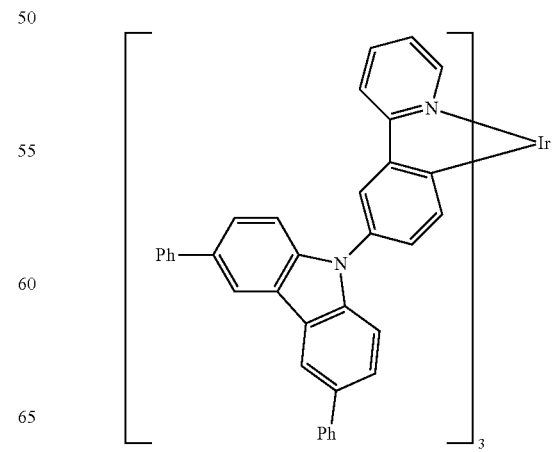

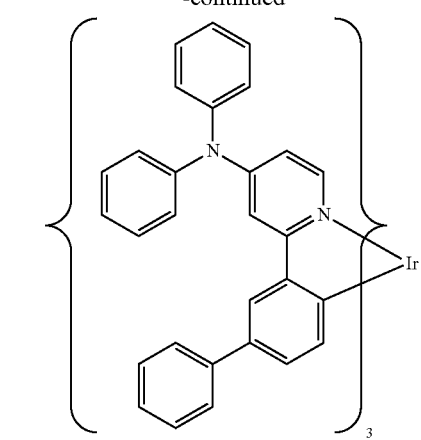
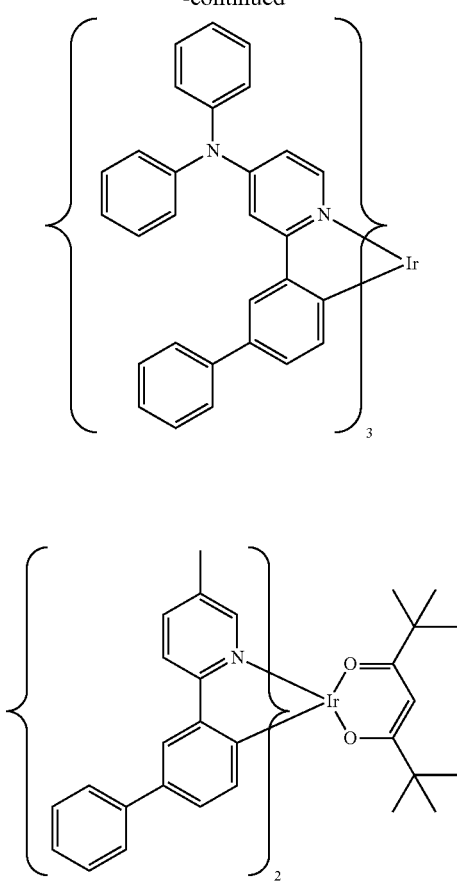
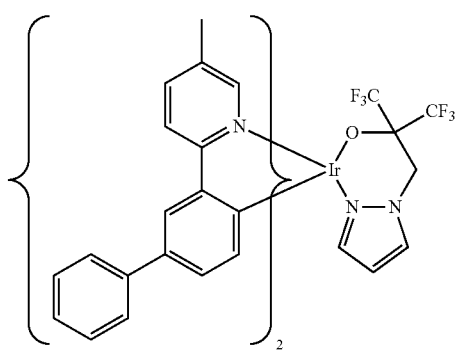
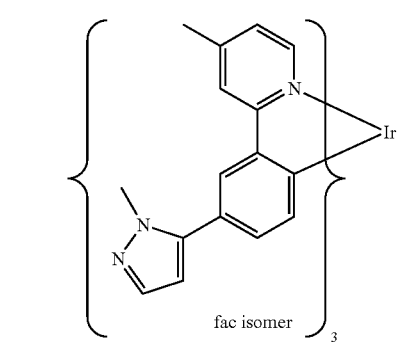
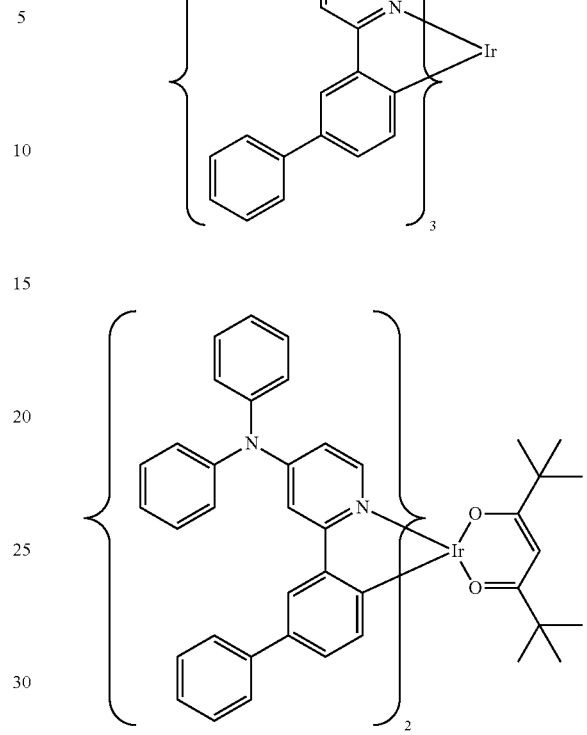
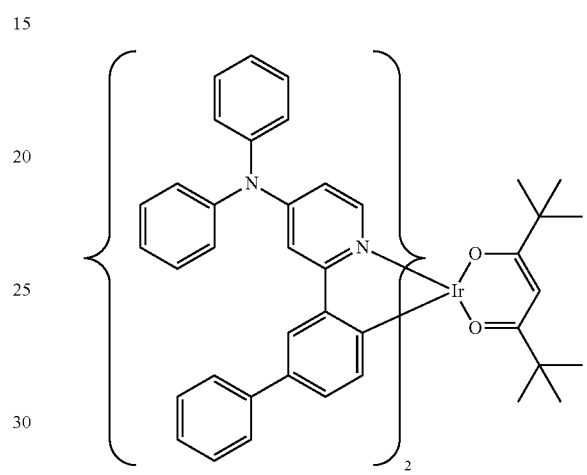
Some non-limiting examples of iridium complex dopants having blue-green to blue emission are given below.
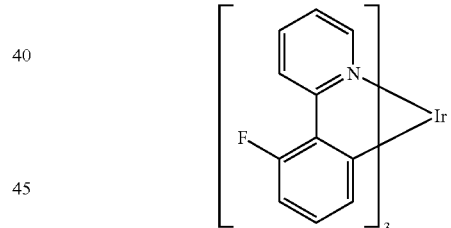
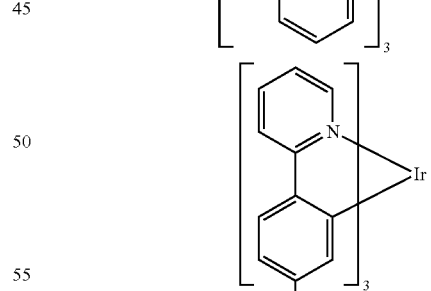
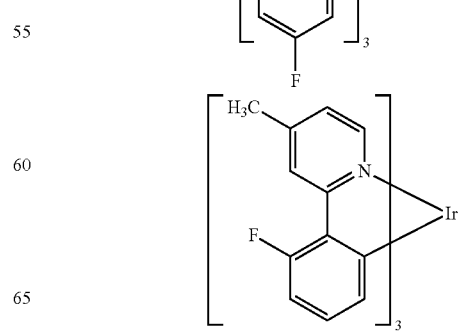

-continued
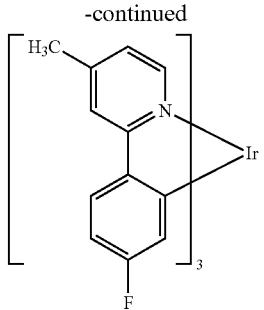
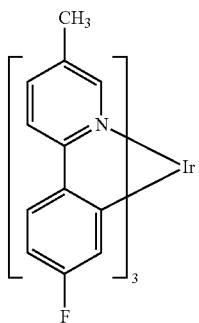
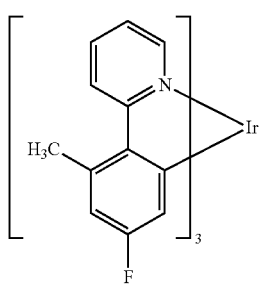
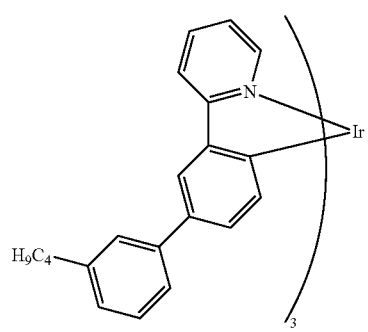
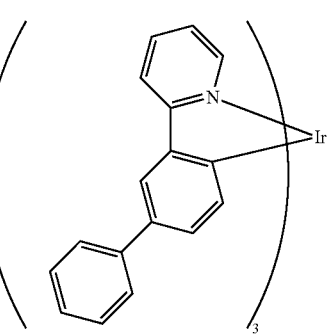
-continued
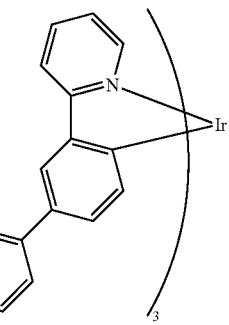
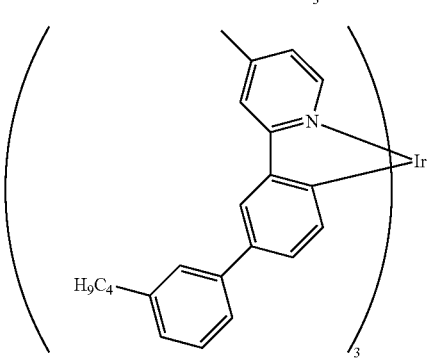
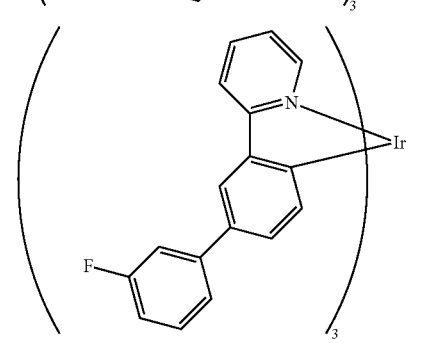
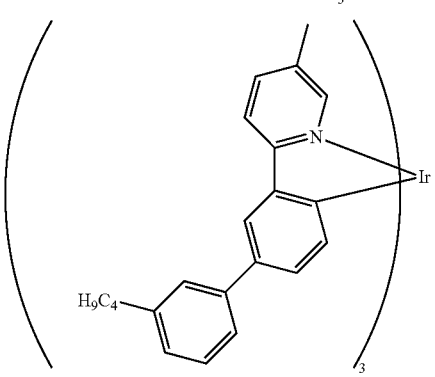
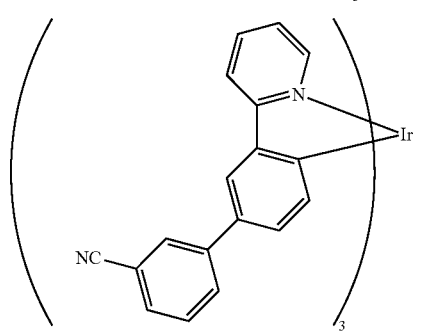

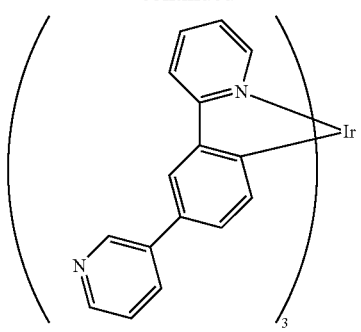
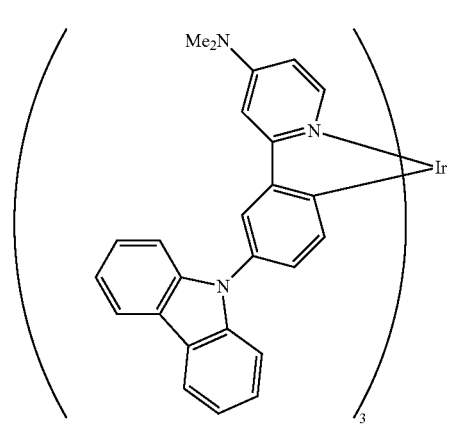
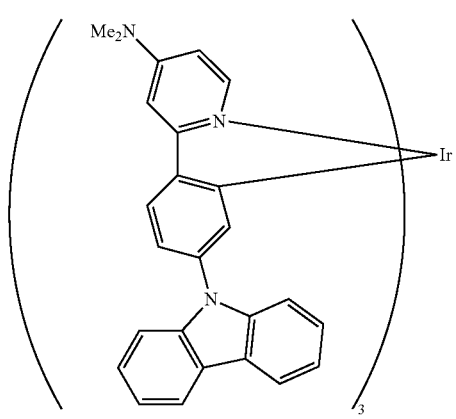
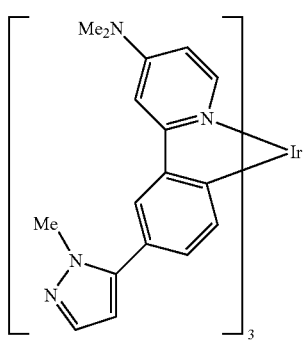
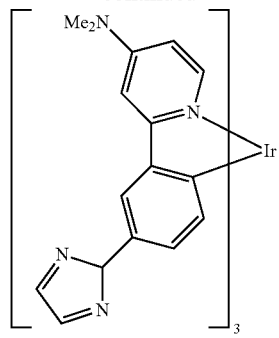
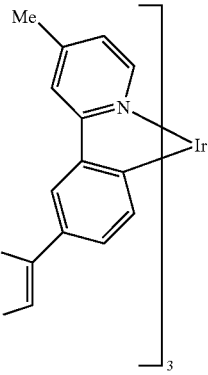
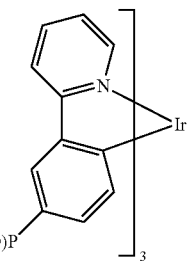
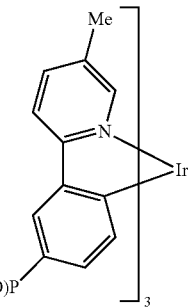
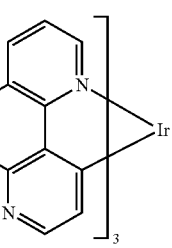

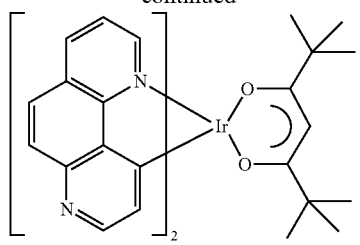
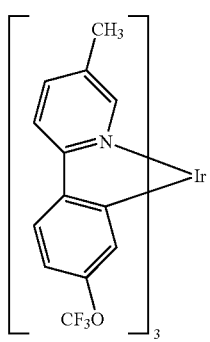
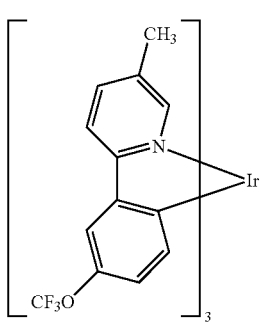
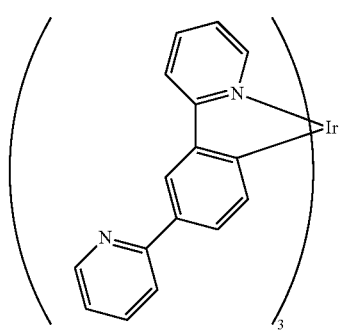
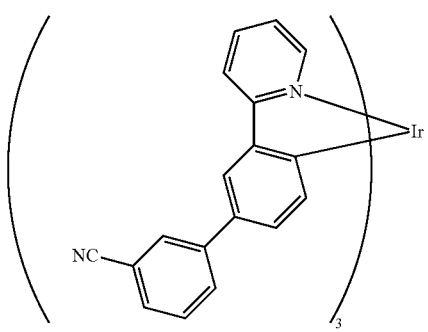
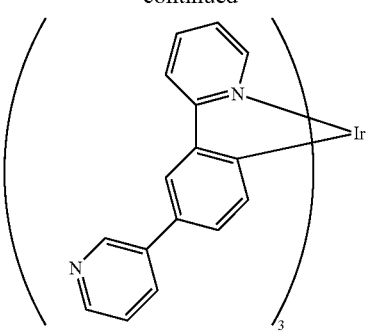
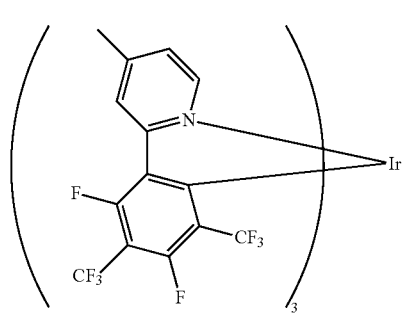
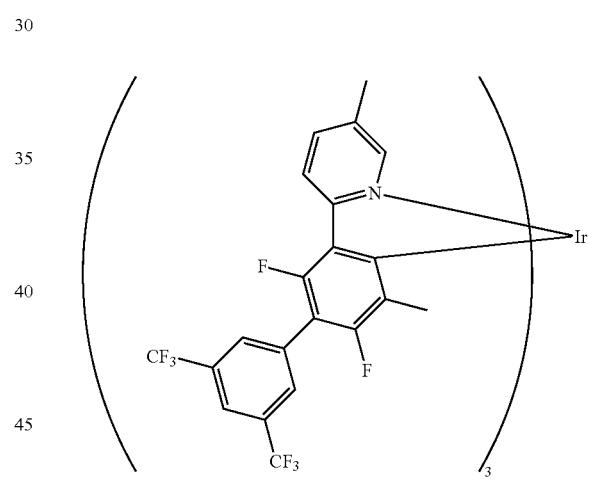
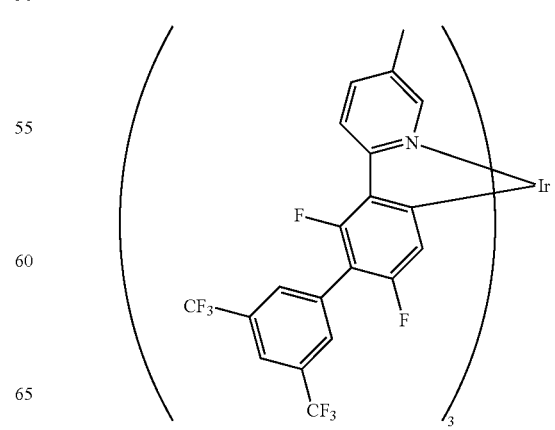

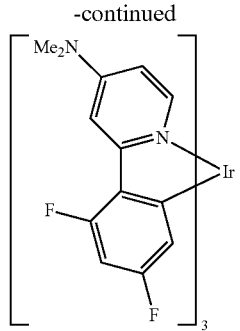
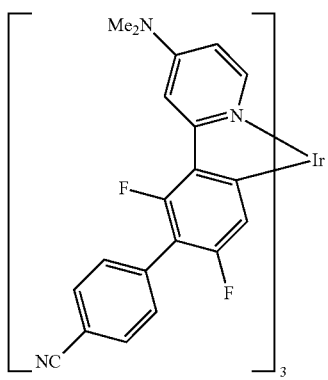
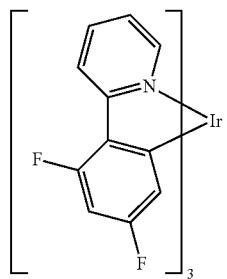
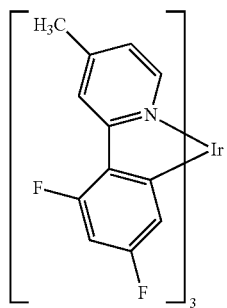
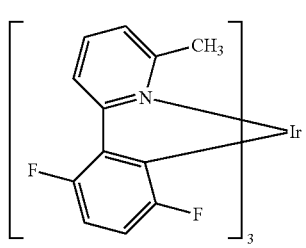
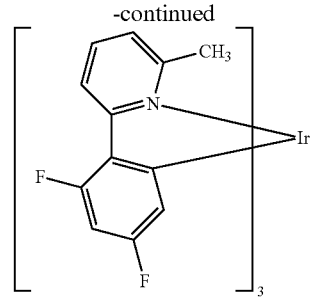
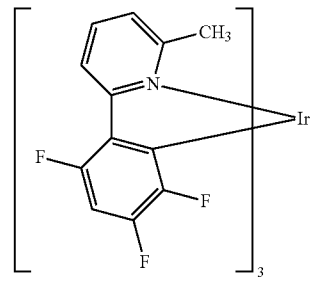
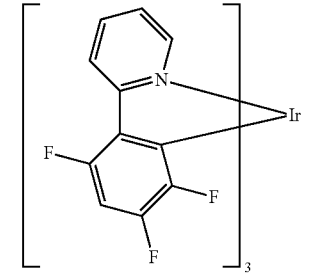
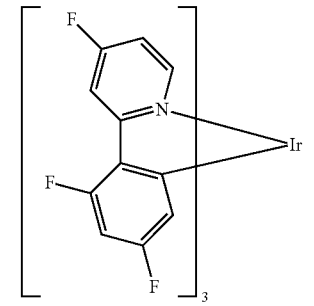
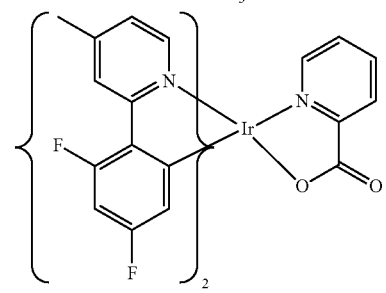
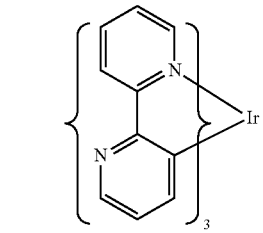

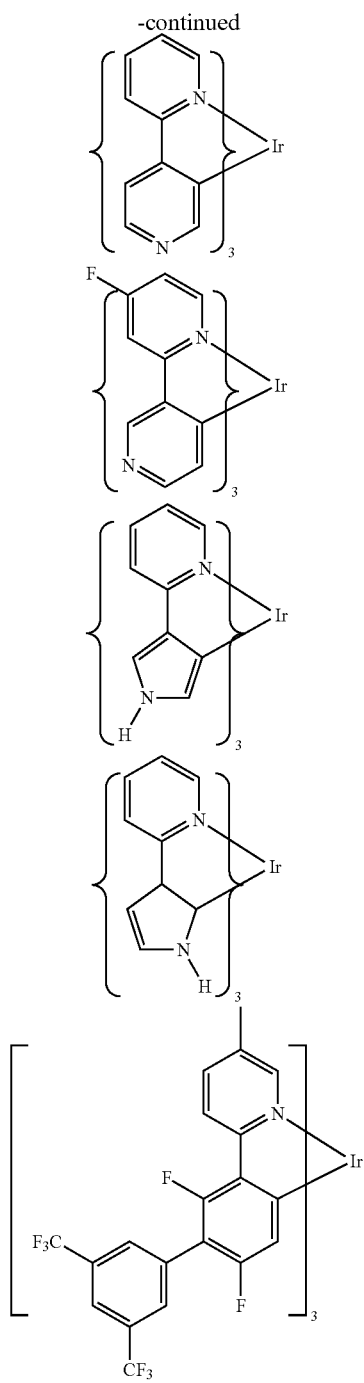

In some embodiments, the dopant is an organic compound. In some embodiments, the dopant is selected from the group consisting of non-polymeric spirobifluorene compounds, fluoranthene compounds, amino-substituted chrysenes and amino-substituted anthracenes.

c. Other Device Layers

The other layers in the device can be made of any materials that are known to be useful in such layers.

The anode 110, is an electrode that is particularly efficient for injecting positive charge carriers. It can be made of, for example, materials containing a metal, mixed metal, alloy, metal oxide or mixed-metal oxide, or it can be a conducting polymer, or mixtures thereof. Suitable metals include the Group 11 metals, the metals in Groups 4-6, and the Group 8-10 transition metals. If the anode is to be light-transmitting, mixed-metal oxides of Groups 12, 13 and 14 metals, such as indium-tin-oxide, are generally used. The anode 110 can also comprise an organic material such as polyaniline as described in "Flexible light-emitting diodes made from soluble conducting polymer," Nature vol. 357, pp 477-479 (11 Jun. 1992). At least one of the anode and cathode is desirably at least partially transparent to allow the generated light to be observed.

The hole injection layer 120 comprises hole injection material and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules. They may be vapour deposited or deposited from liquids which may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like.

The hole injection layer can comprise charge transfer compounds, and the like, such as copper phthalocyanine and the tetrathiafulvalene-tetracyanoquinodimethane system (TTF-TCNQ).

In some embodiments, the hole injection layer comprises at least one electrically conductive polymer and at least one fluorinated acid polymer. Such materials have been described in, for example, published U.S. patent applications US 2004/0102577, US 2004/0127637, and US 2005/0205860, and published PCT application WO 2009/018009.

Examples of electron transport materials which can be used in the electron transport layer 150, include, but are not limited to, metal chelated oxinoid compounds, including metal quinolate derivatives such as tris(8-hydroxyquinolato)aluminum (AlQ), bis(2-methyl-8-quinolinolato)(p-phenylphenolato)aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport material is selected from the group consisting of metal quinolates and phenanthroline derivatives. In some embodiments, the electron transport layer further comprises an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals. Layer 150 can function both to facilitate electron transport, and also serve as a buffer layer or confinement layer to prevent quenching of the exciton at layer interfaces. Preferably, this layer promotes electron mobility and reduces exciton quenching.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li- or Cs-containing organometallic compounds, LiF, CsF, and $Li_2O$ can also be deposited between the organic layer and the cathode layer to lower the operating voltage.

It is known to have other layers in organic electronic devices. For example, there can be a layer (not shown) between the anode 110 and hole injection layer 120 to control the amount of positive charge injected and/or to provide band-gap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency.

The choice of materials for each of the component layers is preferably determined by balancing the positive and negative charges in the emitter layer to provide a device with high electroluminescence efficiency.

It is understood that each functional layer can be made up of more than one layer.

The device can be prepared by a variety of techniques, [including sequential vapor deposition of the individual layers on a suitable substrate. Substrates such as glass, plastics, and metals can be used. Conventional vapor deposition techniques can be used, such as thermal evaporation, chemical vapor deposition, and the like. Alternatively, the organic layers can be applied from solutions or dispersions in suitable solvents, using conventional coating or printing techniques, including but not limited to spin-coating, dip-coating, roll-to-roll techniques, ink-jet printing, screen-printing, gravure printing and the like.

The present invention also relates to an electronic device comprising at least one active layer positioned between two electrical contact layers, wherein the at least one active layer of the device includes the triarylamine described herein. Devices frequently have additional hole transport and electron transport layers.

To achieve a high efficiency OLED, the HOMO (highest occupied molecular orbital) of the hole transport material desirably aligns with the work function of the anode, and the LUMO (lowest un-occupied molecular orbital) of the electron transport material desirably aligns with the work function of the cathode. Chemical compatibility and sublimation temperature of the materials are also important considerations in selecting the electron and hole transport materials.

It is understood that the efficiency of devices made with the anthracene compounds described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

EXAMPLES

The following examples illustrate certain features and advantages of the present invention. They are intended to be illustrative of the invention, but not limiting. All percentages are by weight, unless otherwise indicated.

All calculations were performed with the density functional theory (DFT) methods within the Gaussian 03 suite of programs. (*Gaussian* 03, revision D.01; Gaussian, Inc., Wallingford, C T, 2004). The molecular structures were first optimized at the BP86/6-31G+IrMWB60 level and then used in subsequent analytic vibrational frequency calculations at this same level of computation to ensure that these structures were indeed equilibrium ones. For the excited-state calculations, previous experience has shown that time-dependent DFT (TDDFT) at the B3LYP/6-31 G+IrMWB60 level is satisfactory in computing the first seven singlet and triplet energy transitions. In order to obtain HOMO and LUMO values for these molecules, the B3LYP/6-31+G(d)+IrMWB60 level was used.

The triplet energy of TAPC has been reported as 2.87 eV.

Synthesis Example 1

This example illustrates the synthesis of Polymer I-1, having Formula IA:

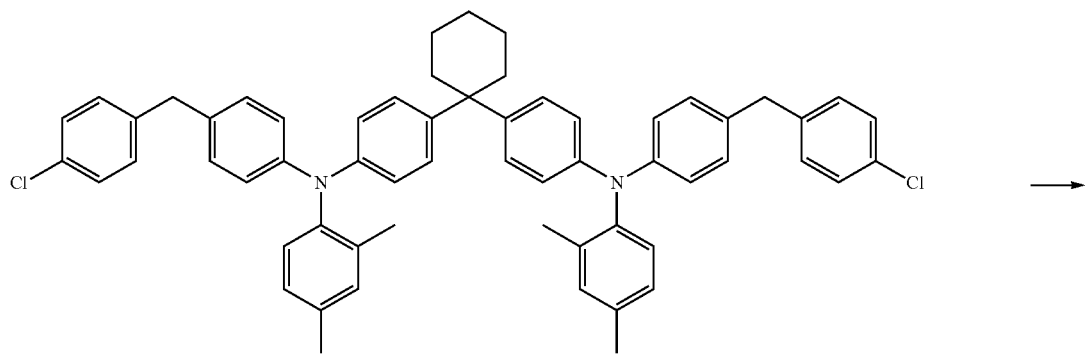

Monomer I-1

-continued

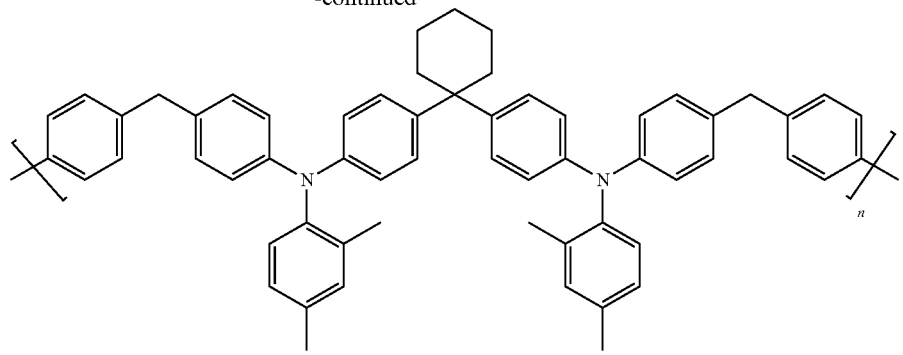

Polymer I-1

Monomer I-1 (0.64 g, 1.1 mmol) was added to a scintillation vial and dissolved in 24 mL toluene. A clean, dry 50 mL Schlenk tube was charged with bis(1,5-cyclooctadiene)nickel(0) (0.611 g, 2.22 mmol). 2,2'-Dipyridyl (0.346 g, 2.22 mmol) and 1,5-cyclooctadiene (5.69 g, 2.22 mmol) were weighed into a scintillation vial and dissolved in 5 mL N,N'-dimethylformamide. The solution was added to the Schlenk tube, which was then inserted into an aluminum block and heated to an internal temperature of 60° C. The catalyst system was held at 60° C. for 45 minutes. The monomer solution in toluene was added to the Schlenk tube and the tube was sealed. The polymerization mixture was stirred at 65° C. for six hours. The Schlenk tube was then removed from the block and allowed to cool to room temperature. 30 mL of conc. HCl was added to the reaction mixture and allowed to stir for 45 minutes. The polymer was collected by vacuum filtration and dried under high vacuum. The polymer was dissolved in toluene (1% wt/v) and passed through a column containing aluminum oxide, basic. (10 gram) layered onto silica gel (10 gram) and florosil (10 g). The polymer/toluene filtrate was concentrated (2.5% wt/v toluene) and triturated with 3-pentanone. The toluene/3-pentanone solution was decanted from the semi-solid polymer which was then dissolved with 16 mL toluene before being poured into stirring methanol to yield Polymer I-1 in 65% yield. GPC analysis with polystyrene standards Mn=23,972; Mw=35,759; PDI=1.49.

The triplet energy of Polymer I-1 was calculated to be 3.01 eV. This is greater than the reported triplet energy of TAPC.

Synthesis Example 2

This example illustrates the synthesis of Polymer III-1, having Formula IIIA:

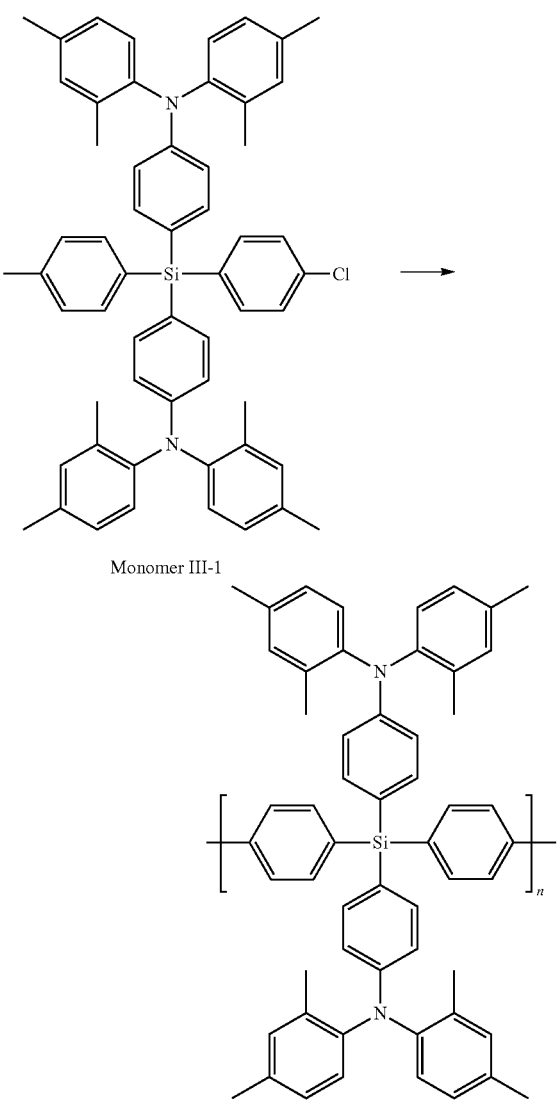

Monomer III-1

Polymer III-1

Monomer III-1 (0.937 g, 1.1 mmol) was added to a scintillation vial and dissolved in 24 mL toluene. A clean, dry 50 mL Schlenk tube was charged with bis(1,5-cyclooctadiene) nickel(0) (0.611 g, 2.22 mmol). 2,2'-Dipyridyl (0.346 g, 2.22 mmol) and 1,5-cyclooctadiene (5.69 g, 2.22 mmol) were weighed into a scintillation vial and dissolved in 5 mL N,N'-dimethylformamide. The solution was added to the Schlenk tube, which was then inserted into an aluminum block and heated to an internal temperature of 60° C. The catalyst system was held at 60° C. for 45 minutes. The monomer solution in toluene was added to the Schlenk tube and the tube was sealed. The polymerization mixture was stirred at 65° C. for six hours. The Schlenk tube was then removed from the block and allowed to cool to room temperature. 30 mL of conc. HCl was added to the reaction mixture and allowed to stir for 45 minutes. The polymer was collected by vacuum filtration and dried under high vacuum. The polymer was dissolved in toluene (1% wt/v) and passed through a column containing aluminum oxide, basic. (10 gram) layered onto silica gel (10 gram) and florosil (10 g). The polymer/toluene filtrate was concentrated (2.5% wt/v toluene) and triturated with 3-pentanone. The toluene/3-pentanone solution was decanted from the semi-solid polymer which was then dissolved with 16 mL toluene before being poured into stirring methanol to yield Polymer III-1 in 66% yield. GPC analysis with polystyrene standards Mn=5, 318; Mw=8,633; PDI=1.6.

The triplet energy of Polymer III-1 was calculated to be 3.17 eV. This is greater than the reported triplet energy for TAPC.

Device Examples

In Device Examples 1, 2 and 3, devices were made by a combination of solution processing and vapor deposition techniques. A substrate with 80 nm indium tin oxide ("ITO") was used as the anode. HIJ-1 was applied by spin coating from an aqueous dispersion. The other materials were applied by evaporative deposition. The device structure was:

anode: ITO (80 nm)

hole injection layer: HIJ-1 (60 nm)

hole transport layer (HTL): materials shown in Table 1 (13-20 nm)

electroactive layer: 8% Green-I in Host-1 (64.8 nm)

first electron transport layer: ET-1 (5 nm)

second electron transport layer: ET-2 (15 nm)

electron injection layer: LiF (1 nm deposited)

cathode: Al (100 nm)

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The external quantum efficiency (EQE) is then calculated from the current efficiency (cd/A) and the electroluminance spectra, assuming a Lambertian distribution of emitted light. The results are shown in Table 1.

TAPC:

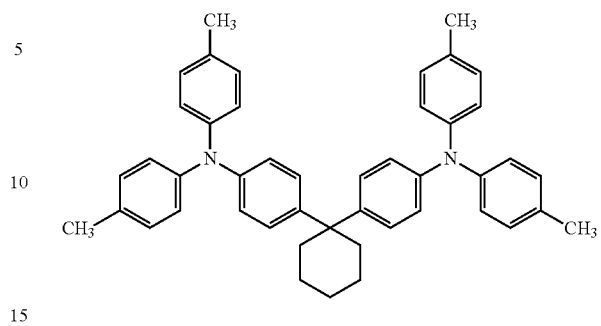

Green-1:

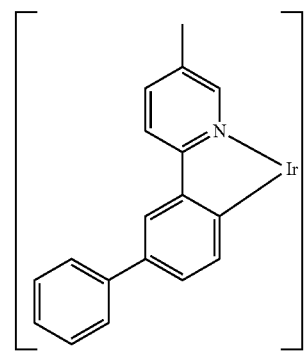

Host-1 is an indolocarbazole.
ET-1 and ET-2 are commonly used electron transport materials.

TABLE 1

Device Results

| Device Example | HTL | External Quantum efficiency @1000 nits | Current efficiency @1000 nits | Color (x, y) |
|---|---|---|---|---|
| Example 1 | TAPC | 17.5% | 64 cd/A | (0.317, 0.647) |
| Example 2 | Polymer I-1 | 22.5% | 81 cd/A | (0.313, 0.649) |
| Example 3 | Polymer III-1 | 21.5% | 80 cd/A | (0.320, 0.649) |

HTL = hole transport layer; x and y are the color coordinates according to the C.I.E. chromaticity scale (Commission Internationale de L'Eclairage, 1931).

The external quantum efficiency and the current efficiency are greater with the new triarylamine compounds of the invention.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. A triarylamine having Formula I

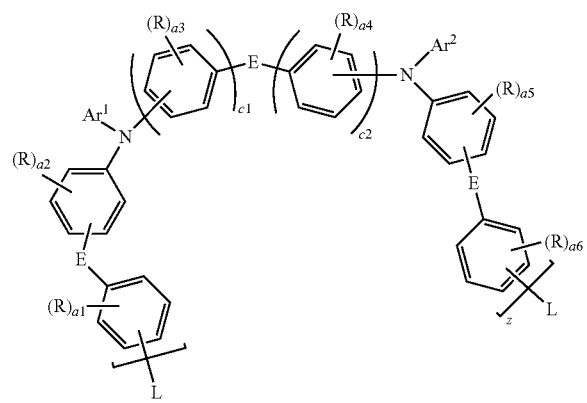

where:
E is the same or different at each occurrence and is $(CR'_2)_x$;
R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, and aromatic ring, or deuterated analog thereof;
R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;
L is the same or different at each occurrence and is selected from the group consisting of crosslinkable groups and deuterated crosslinkable groups;
$Ar^1$ and $Ar^2$ are the same or different and are selected from the group consisting of unsubstituted and substituted C6-20 aryl groups, where the substituent is selected from the group consisting of D, alkyl, silyl, germyl, deuterated alkyl, deuterated silyl, deuterated germyl, and combinations thereof;
a1-a6 are the same or different at each occurrence and are an integer of 0-4;
c1 and c2 are the same or different and are an integer of 1-4;
x is an integer of 1-6; and
z=1.

2. A triarylamine having Formula I

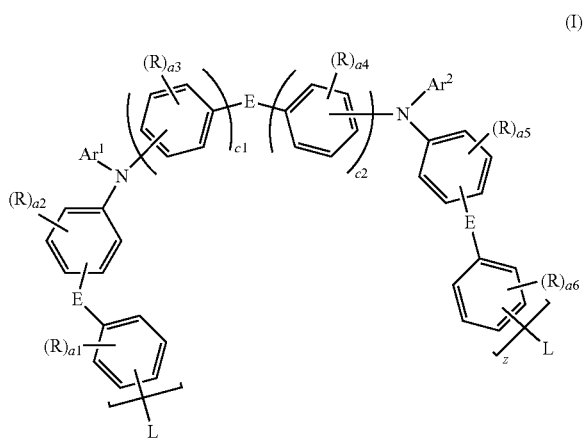

where:
E is the same or different at each occurrence and is $(CR'_2)_x$;
R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;
R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;
L is the same or different at each occurrence and is selected from the group consisting of H, D, aryl, and deuterated aryl;
$Ar^1$ and $Ar^2$ are the same or different and are selected from the group consisting of unsubstituted and substituted C6-20 aryl groups, where the substituent is selected from the group consisting of D, alkyl, silyl, germyl, deuterated alkyl, deuterated silyl, deuterated germyl, and combinations thereof;
a1-a6 are the same or different at each occurrence and are an integer of 0-4;
c1 and c2 are the same or different and are an integer of 1-4;
x is an integer of 1-6; and
z is an integer greater than 5 and the triarylamine is a polymer.

3. The triarylamine of claim 1, which is at least 10% deuterated.

4. The triarylamine of claim 1 having Formula IA

8. The device of claim 5, wherein the triarylamine has Formula IA

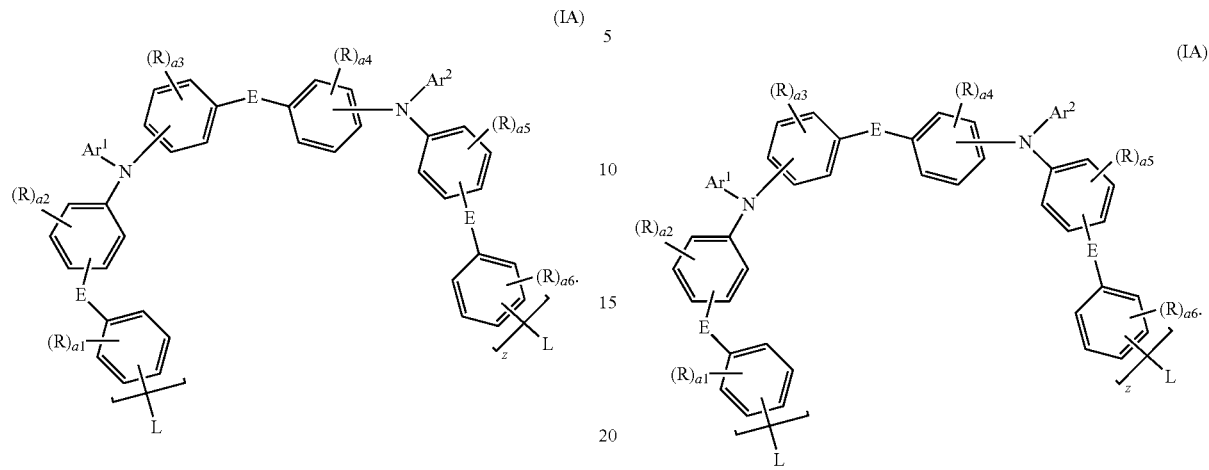

5. An organic electronic device comprising a first electrical contact layer, a second electrical contact layer, and at least one active layer there between, wherein the active layer comprises a triarylamine according to claim 1.

6. The device of claim 5, wherein the active layer is a hole transport layer.

7. The device of claim 5, wherein the active layer is a photoactive layer.

9. The triarylamine of claim 1, wherein the triplet energy level is greater than 2.1 eV.

10. The triarylamine of claim 1, wherein the triplet energy level is greater than 2.5 eV.

11. The triarylamine of claim 1, selected from the group consisting of

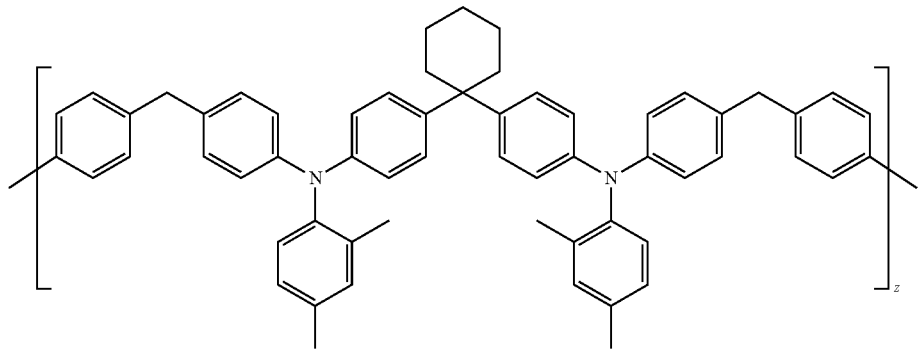

Polymer I-1

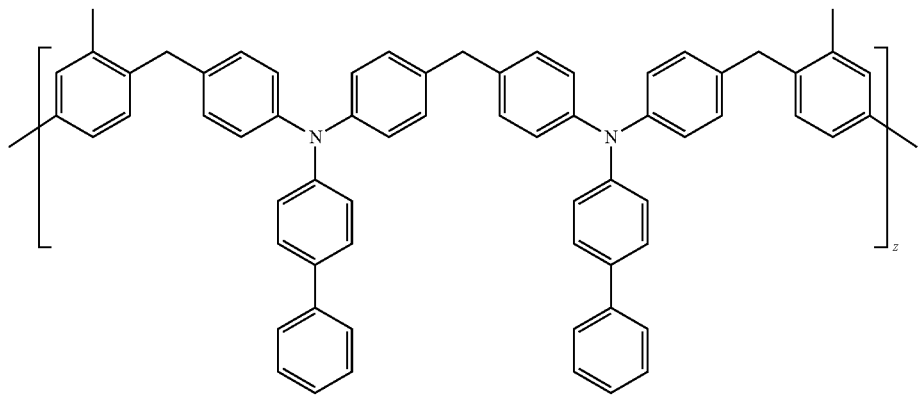

Polymer I-3

Polymer I-4

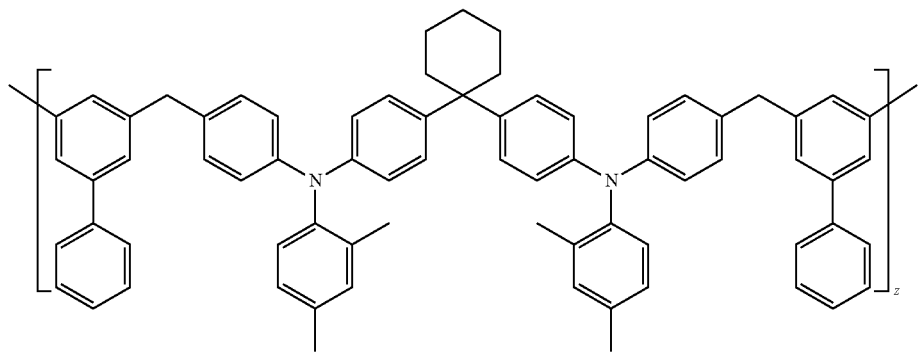

Polymer I-5

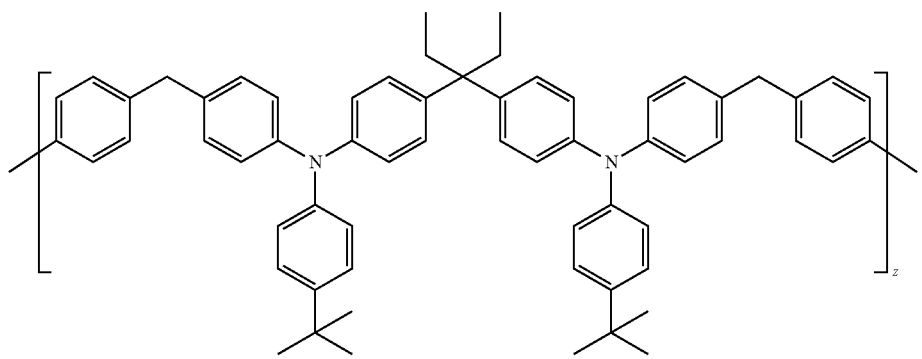

and

Polymer I-6

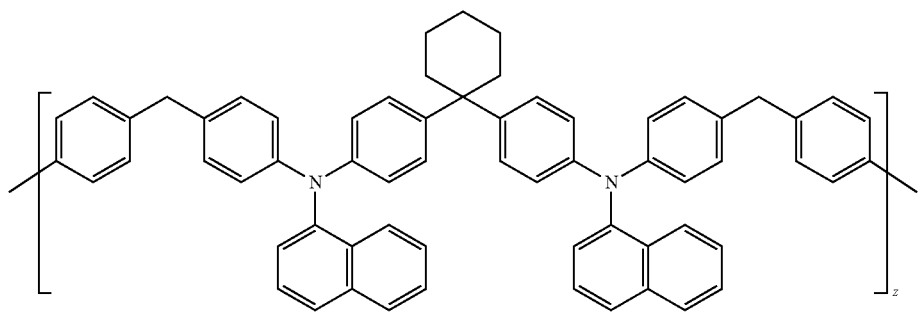

where z >5.

12. An electroactive composition comprising
(a) a triarylamine having Formula I

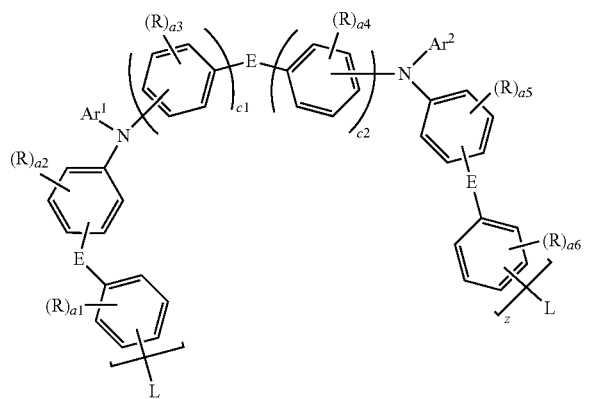

(I)

where:

E is the same or different at each occurrence and is $(CR'_2)_x$;

R is the same or different at each occurrence and is selected from the group consisting of D, alkyl, silyl, germyl, aryl, deuterated alkyl, deuterated silyl, deuterated germyl, and deuterated aryl, where two adjacent R groups can be joined together to form a cycloaliphatic ring, an aromatic ring, or deuterated analog thereof;

R' is the same or different at each occurrence and is selected from the group consisting of H, D, alkyl, silyl, germyl, aryl, deuterated alkyl, deuterated silyl, deuterated germyl, and deuterated aryl, where two adjacent R' groups can be joined together to form a cycloaliphatic ring or deuterated cycloaliphatic ring;

L is the same or different at each occurrence and is selected from the group consisting of H, D, aryl, and deuterated aryl;

$Ar^1$ and $Ar^2$ are the same or different and are selected from the group consisting of unsubstituted and substituted C6-20 aryl groups, where the substituent is selected from the group consisting of D, alkyl, silyl, germyl, deuterated alkyl, deuterated silyl, deuterated germyl, and combinations thereof;

a1-a6 are the same or different at each occurrence and are an integer of 0-4;

c1 and c2 are the same or different and are an integer of 1-4;

x is an integer of 1-6;

z is an integer greater than 5 and the triarylamine is a polymer;

and (b) an organometallic dopant capable of electroluminescence having an emission maximum between 380 and 750 nm.

13. The electroactive composition of claim 12, wherein the triarylamine has Formula IA

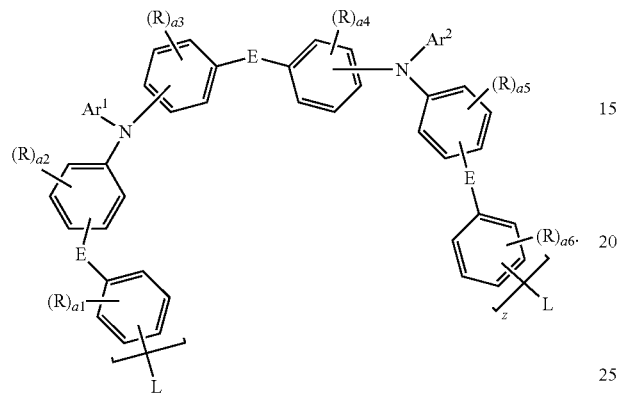

(IA)

14. An organic electronic device comprising a first electrical contact layer, a second electrical contact layer, and at least one active layer there between, wherein the active layer comprises the composition according to claim 12.

* * * * *